United States Patent
Yoshida

(10) Patent No.: US 12,237,408 B2
(45) Date of Patent: *Feb. 25, 2025

(54) SEMICONDUCTOR DEVICE AND PRODUCTION METHOD

(71) Applicant: FUJI ELECTRIC CO., LTD., Kanagawa (JP)

(72) Inventor: Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/395,756

(22) Filed: Dec. 26, 2023

(65) Prior Publication Data

US 2024/0128360 A1 Apr. 18, 2024

Related U.S. Application Data

(63) Continuation of application No. 17/210,498, filed on Mar. 24, 2021, now Pat. No. 11,955,540, which is a continuation of application No. PCT/JP2020/006938, filed on Feb. 20, 2020.

(30) Foreign Application Priority Data

Apr. 16, 2019 (JP) .................................. 2019-077535

(51) Int. Cl.
*H01L 29/739* (2006.01)
*H01L 29/861* (2006.01)

(52) U.S. Cl.
CPC ........ *H01L 29/7397* (2013.01); *H01L 29/861* (2013.01)

(58) Field of Classification Search
CPC .......................... H01L 29/7397; H01L 29/861
(Continued)

(56) References Cited

U.S. PATENT DOCUMENTS 11,995,540 B2 * 5/2024 Kajino .................. G06N 3/044
2001/0054738 A1 12/2001 Momota
(Continued)

FOREIGN PATENT DOCUMENTS

CN  108604594 A   9/2018
JP  2001308327 A  11/2001
(Continued)

OTHER PUBLICATIONS (ISA/237) Written Opinion of the International Search Authority for International Patent Application No. PCT/JP2020/006938, issued/mailed by the Japan Patent Office on Apr. 21, 2020.
(Continued)

*Primary Examiner* — Igwe U Anya

(57) ABSTRACT

Provided is a semiconductor device, comprising a semiconductor substrate and a first electrode provided above an upper surface of the semiconductor substrate. The semiconductor substrate has a first conductive type drift region. The semiconductor substrate has a second conductive type base region provided between the drift region and the upper surface of the semiconductor substrate. The semiconductor substrate has a second conductive type contact region with a higher impurity concentration than the base region, which is provided between the base region and the upper surface of the semiconductor substrate. The semiconductor substrate has a trench contact that has a conductive material in an interior of a groove portion penetrating the contact region, the conductive material being in contact with at least a part of the semiconductor substrate, and connected to the first electrode.

20 Claims, 14 Drawing Sheets

(58) Field of Classification Search
USPC .......................................................... 257/140
See application file for complete search history.

(56) References Cited

U.S. PATENT DOCUMENTS

| | | |
|---|---|---|
| 2005/0167748 A1 | 8/2005 | Onda |
| 2009/0212359 A1 | 8/2009 | Hsieh |
| 2012/0061724 A1 | 3/2012 | Ogura |
| 2016/0181413 A1 | 6/2016 | Fujita |
| 2017/0047316 A1* | 2/2017 | Katou ................. H01L 27/0211 |
| 2017/0110571 A1 | 4/2017 | Kobayashi |
| 2017/0141216 A1 | 5/2017 | Abe |
| 2017/0263740 A1 | 9/2017 | Onozawa |
| 2018/0108738 A1 | 4/2018 | Naito |
| 2018/0151711 A1 | 5/2018 | Yamada |
| 2018/0226400 A1 | 8/2018 | Shinsho |
| 2018/0308839 A1 | 10/2018 | Takahashi |
| 2018/0350961 A1 | 12/2018 | Naito |
| 2018/0350968 A1 | 12/2018 | Aichinger |
| 2018/0366548 A1 | 12/2018 | Naito |
| 2019/0081030 A1* | 3/2019 | Katou ............... H01L 29/66734 |
| 2019/0097030 A1 | 3/2019 | Miyata |
| 2019/0140084 A1 | 5/2019 | Shirakawa |
| 2019/0221642 A1 | 7/2019 | Naito |
| 2020/0075752 A1 | 3/2020 | Shimosawa |
| 2023/0207674 A1 | 6/2023 | Kubouchi |

FOREIGN PATENT DOCUMENTS

| | | | |
|---|---|---|---|
| JP | 2005209807 A | 8/2005 | |
| JP | 2010147380 A | 7/2010 | |
| JP | 2010147381 A | 7/2010 | |
| JP | 2010267863 A | 11/2010 | |
| JP | 2012064686 A | 3/2012 | |
| JP | 2012156564 A | 8/2012 | |
| JP | 2015079894 A | 4/2015 | |
| JP | 2016115886 A | 6/2016 | |
| JP | 2017079251 A | 4/2017 | |
| JP | 2017168829 A | 9/2017 | |
| JP | 2018060984 A | 4/2018 | |
| JP | 2018120990 A | 8/2018 | |
| JP | 2018133579 A | 8/2018 | |
| JP | 2018190948 A | 11/2018 | |
| WO | 2016125490 A1 | 8/2016 | |
| WO | 2018052099 A1 | 3/2018 | |

OTHER PUBLICATIONS

Extended European Search Report for European Patent Application No. 20790892.2, issued by the European Patent Office on Oct. 25, 2021.

Office Action issued for counterpart Korean Application 10-2021-7009009, issued by the Korean Intellectual Property Office on Jul. 19, 2022.

Office Action issued for counterpart Japanese Application No. 2022-096433, issued by the Japanese Patent Office on Jun. 27, 2023 (drafted on Jun. 20, 2023).

Office Action issued for counterpart Chinese Application 202080005494.6, issued by The State Intellectual Property Office of People's Republic of China on Nov. 27, 2023.

Those references were submitted as IDS or found by the examiner over the earlier U.S. Appl. No. 17/210,498, filed Mar. 24, 2021.

* cited by examiner

SEMICONDUCTOR DEVICE AND PRODUCTION METHOD

CROSS-REFERENCE TO RELATED APPLICATIONS

This application is a continuation of U.S. patent application Ser. No. 17/210,498 filed on Mar. 24, 2021, which is a continuation of PCT Patent Application No. PCT/JP2020/006938 filed on Feb. 20, 2020, which claims priority to Japanese Patent Application NO. 2019-077535 filed on Apr. 16, 2019, the entirety of the contents of each of which are hereby incorporated herein by reference.

BACKGROUND

1. Technical Field

The present invention relates to a semiconductor device and a production method.

2. Related Art

Conventionally, semiconductor devices have been known in which transistors such as insulated gate bipolar transistors (IGBTs) are provided (refer to Patent Document 1 to 3, for example).

PRIOR ART DOCUMENTS

Patent Documents

Patent Document 1: Japanese Patent Application Publication No. 2010-147381
Patent Document 2: Japanese Patent Application Publication No. 2012-156564
Patent Document 3: Japanese Patent Application Publication No. 2010-147380

3. Technical Problem

A semiconductor device preferably has a small loss.

GENERAL DISCLOSURE

To solve the above problem, a first aspect of the present invention provides a semiconductor device including a semiconductor substrate and a first electrode provided above an upper surface of the semiconductor substrate. The semiconductor substrate may have a first conductive type drift region. The semiconductor substrate may have a second conductive type base region provided between the drift region and the upper surface of the semiconductor substrate. The semiconductor substrate may have a second conductive type contact region with a higher impurity concentration than the base region, which is provided between the base region and the upper surface of the semiconductor substrate. The semiconductor substrate may have a trench contact that has a conductive material in an interior of a groove portion penetrating the contact region, the conductive material being in contact with at least a part of the semiconductor substrate, and connected to the first electrode. The semiconductor substrate may have a second conductive type first high-concentration region with a higher impurity concentration than the base region, which is provided under a bottom surface of the groove portion. The upper surface of the first high-concentration region may be provided in a position deeper than the contact region in an interior of the semiconductor substrate.

In a depth direction of the semiconductor substrate, a thickness of the first high-concentration region may be less than a thickness of the contact region.

The lower end of the first high-concentration region may be arranged above a lower end of the base region.

The semiconductor substrate may have a first conductive type second high-concentration region with a higher impurity concentration than the drift region, which is provided between the base region and the upper surface of the semiconductor substrate. The conductive material may be in contact with the second high-concentration region.

The contact region may be provided in a position deeper than the second high-concentration region.

The conductive material may be in contact with the contact region.

The conductive material may be in contact with the first high-concentration region.

The semiconductor substrate may be a silicon substrate or a compound semiconductor substrate.

The conductive material may be formed of the same material as the first electrode and may be provided continuously with the first electrode. The semiconductor substrate may have a plurality of trench portions provided from the upper surface of the semiconductor substrate to the drift region. The semiconductor substrate may have a mesa portion sandwiched between two trench portions of the plurality of trench portions. The plurality of trench portions may have a conductive portion. The interlayer dielectric film may be provided between the conductive portion and the first electrode. The plurality of trench portions may be arranged along a first direction in a top view. The width of the groove portion in the first direction may be once or more of a distance in the first direction between the groove portion and the trench portion. The first high-concentration region may cover the bottom surface of the groove portion. The plurality of trench portions may be arranged along a first direction in a top view. The width of the first high-concentration region in the first direction may be larger than a width of the bottom surface of the groove portion in the first direction. The plurality of trench portions may include a gate trench portion and a dummy trench portion. The plurality of trench portions may be arranged along a first direction in a top view. At an end region that is an end of active portion in the first direction, the trench contact may be provided. The semiconductor substrate may have a second conductive type well region that has a bottom surface in a position deeper than the base region, and covers the active portion. The end region may be located between the well region and the trench portion in an outermost in a first direction. The interlayer dielectric film may be provided between the semiconductor substrate and the first electrode. The semiconductor substrate may have a floating mesa portion that is provided between two of the plurality of trench portions, and is electrically insulated from the first electrode by the interlayer dielectric film. At least a part of the interlayer dielectric film may be embedded in the trench portion.

A second aspect of the present invention provides a production method of a semiconductor device including a semiconductor substrate having a first conductive type drift region, a second conductive type base region provided between the drift region and an upper surface of the semiconductor substrate, and a second conductive type contact region with a higher impurity concentration than the base region, which is provided between the base region and the upper surface of the semiconductor substrate. The production method may comprise forming a groove portion penetrating the contact region by etching the upper surface of the semiconductor substrate. The production method may include forming a second conductive type first high-concentration region with a higher doping concentration than the base region, under a bottom surface of the groove portion. The production method may include forming a trench contact, by providing a conductive material being in contact with at least a part of the semiconductor substrate, in an interior of the groove portion. The production method may include forming a first electrode above the upper surface of the semiconductor substrate. The upper surface of the first high-concentration region may be provided in a position deeper than the contact region in an interior of the semiconductor substrate. The production method may include forming an interlayer dielectric film in an interior of the groove portion and on the upper surface of the semiconductor substrate and etching back the interlayer dielectric film on the upper surface of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Figure 1:
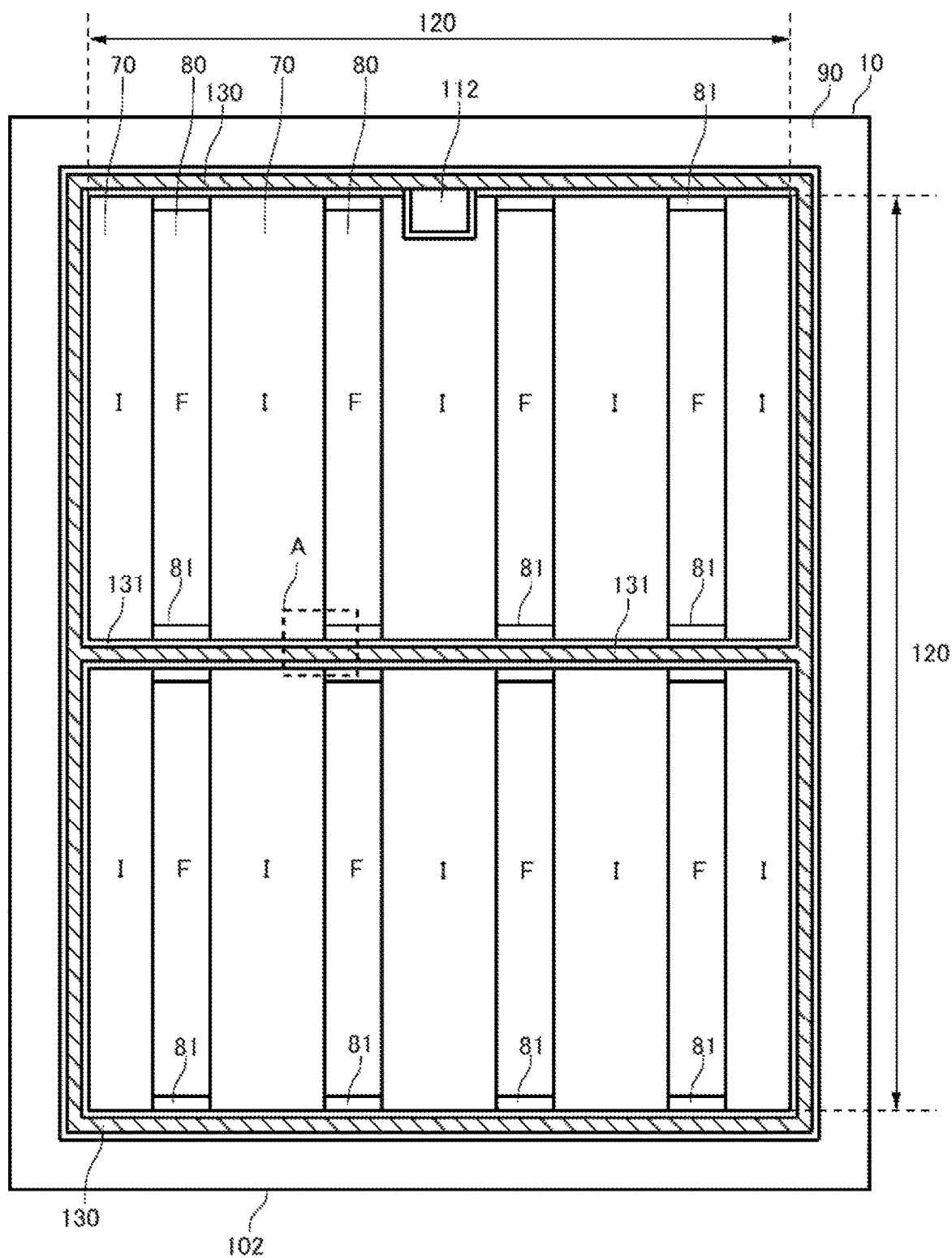
FIG. 1 illustrates a top view showing one example of a semiconductor device 100 according to one embodiment of the present invention.

Hereinafter, the present invention will be described with reference to embodiments of the invention. However, the following embodiments shall not be construed as limiting the claimed invention. Also, not all combinations of features described in the embodiments are essential for means to solve problems provided by aspects of the invention.

In this specification, one side of the semiconductor substrate in the direction parallel to the depth direction is referred to as "upper" and the other side is referred to as "lower". Of the two main surfaces of the substrate, layer or other member, one surface is referred to as the upper surface and the other surface is referred to as the lower surface. The directions of "upper" and "lower" are not limited to the direction of gravity or the direction in which the semiconductor device is implemented.

In this specification, the orthogonal coordinate axes of the X, Y and Z axes may be used to describe technical matters. The orthogonal coordinate axes only identify the relative positions of the components and does not limit the specific direction. For example, the Z axis does not indicate a limited height direction with respect to the ground. Additionally, the +Z axis direction and the −Z axis direction are opposite directions to each other. When described as the Z axis direction without describing positive or negative, it means the direction parallel to the +Z and −Z axes. And in this specification, viewing from the +Z axis direction may be referred to as a top view.

In this specification, when referred to as "same" or "equal", it may also include cases with errors due to producing variation and so on. The errors in this case are, for example, within 10%.

In this specification, the conductive type of the doping region doped with impurities is described as P type or N type. However, the conductive type of each doping region may also be of the opposite polarity. Also, in this specification, when described as P+ type or N+ type, it means the doping concentration is higher than P type or N type; when described as P− type or N− type, it means the doping concentration is lower than P type or N type. Also, in this specification, when described as P++ type or N++ type, it means the doping concentration is higher than P+ type or N+ type.

In this specification, the doping concentration refers to the concentration of impurity activated as the donor or acceptor. In this specification, the concentration difference of the donor and acceptor may be the doping concentration. The concentration difference in this case can be measured by voltage-capacitance measurement method (CV method). Also, the carrier concentration measured by spreading resistance measurement method (SR) may be the doping concentration. Also, when there is a peak in the doping concentration distribution, the peak value in this case may be the doping concentration in the region. In the case where the doping concentration is approximately uniform in a region where the donor or acceptor exists or the like, the average value of the doping concentration may be the doping concentration in the region. Also, the dopant concentration in this specification refers to the respective concentrations of the donor and acceptor.

FIG. 1 illustrates a top view showing one example of a semiconductor device 100 according to one embodiment of the present invention. In FIG. 1, the projected position of each member on the upper surface of the semiconductor substrate 10 is shown. In FIG. 1, only some of the members of the semiconductor device 100 are shown, and some of the members are omitted.

The semiconductor device 100 includes a semiconductor substrate 10. The semiconductor substrate 10 is a substrate formed of a semiconductor material such as silicon or a compound semiconductor. The semiconductor substrate 10 has an end side 102 in a top view. In this specification, when simply referring to a top view, it means viewing from the upper surface side of the semiconductor substrate 10. The semiconductor substrate 10 of this example has two pairs of end sides 102 facing each other in a top view. In FIG. 1, the X axis and the Y axis are parallel to any of the end sides 102. And the Z axis is perpendicular to the upper surface of the semiconductor substrate 10.

An active portion 120 is provided in the semiconductor substrate 10. The active portion 120 is the region where a main current flows in the depth direction between the upper surface and the lower surface of the semiconductor substrate 10, when the semiconductor device 100 is controlled to the on-state. Although the emitter electrode is provided above the active portion 120, it is omitted in FIG. 1.

A transistor portion 70 including transistor elements such as IGBTs is provided in the active portion 120. A diode portion 80 including diode elements such as freewheeling diodes (FWDs) may also be further provided in the active portion 120.

In FIG. 1, the region where the transistor portion 70 is arranged is marked with symbol "I" and the region where the diode portion 80 is arranged is marked with symbol "F". The transistor portion 70 and the diode portion 80 are arranged side-by-side along a predetermined array direction (the X axis direction in FIG. 1). The transistor portion 70 and the diode portion 80 may be arranged alternately side-by-side in the X axis direction. In this specification, the direction perpendicular to the array direction in a top view may be referred to as an extending direction (the Y axis direction in FIG. 1). Each of the transistor portion 70 and the diode portion 80 may have a longitudinal length in the extending direction. That is, the length in the Y axis direction of the transistor portion 70 is greater than the width in the X axis direction. Similarly, the length in the Y axis direction of the diode portion 80 is greater than the width in the X axis direction. The extending directions of the transistor portion 70 and the diode portion 80 may be the same as the longitudinal direction of the trench portion.

The diode portion 80 has an N+ type cathode region in the region in contact with the lower surface of the semiconductor substrate 10. In this specification, the region where the cathode region is provided is referred to as the diode portion 80. That is, the diode portion 80 is a region overlapping the cathode region in a top view. A P+ type collector region may be provided in a region other than the cathode region on the lower surface of the semiconductor substrate 10. In this specification, the extension region 81 that has extended the diode portion 80 to the gate runner described below in the Y axis direction may also be included in the diode portion 80. A collector region is provided on the lower surface of the extension region 81.

The semiconductor device 100 may have one or more pads above the semiconductor substrate 10. The semiconductor device 100 of this example has a gate pad 112. The semiconductor device 100 may also have pads such as anode pads, cathode pads and current detection pads. Each pad is arranged in the vicinity of the end side 102. The vicinity of the end side 102 refers to a region between the end side 102 and the emitter electrode in a top view. During implementing the semiconductor device 100, each pad may be connected to an external circuit via a wiring such as a wire.

A gate potential is applied to the gate pad 112. The gate pad 112 is electrically connected to a conductive portion of a gate trench portion of an active portion 120. The semiconductor device 100 includes a gate runner connecting the gate pad 112 and the gate trench portion. In FIG. 1, the gate runner is marked by oblique hatched lines.

The gate runner of this example has an outer circumferential gate runner 130 and an active side gate runner 131. The outer circumferential gate runner 130 is arranged between the active portion 120 and the end side 102 of the semiconductor substrate 10 in a top view. The outer circumferential gate runner 130 of this example encloses the active portion 120 in a top view. The region enclosed by the outer circumferential gate runner 130 in a top view may also be referred to as the active portion 120. Also, the outer circumferential gate runner 130 is connected to the gate pad 112. The outer circumferential gate runner 130 is arranged above the semiconductor substrate 10. The outer circumferential gate runner 130 may be a metallic wiring.

The active side gate runner 131 is provided in the active portion 120. By providing the active side gate runner 131 in the active portion 120, it is possible to reduce the variation in the runner length from the gate pad 112 in each region of the semiconductor substrate 10.

The active side gate runner 131 is connected to the gate trench portion of the active portion 120. The active side gate runner 131 is arranged above the semiconductor substrate 10. The active side gate runner 131 may be a runner formed of a semiconductor such as polysilicon doped with impurities.

The active side gate runner 131 may be connected to the outer circumferential gate runner 130. The active side gate runner 131 of this example is provided to extend in the X axis direction from one outer circumferential gate runner 130 to the other outer circumferential gate runner 130 at substantially the center in the Y axis direction so as to cross the active portion 120.

Also, the semiconductor device 100 may also include a not shown temperature sense portion that is a PN junction diode formed of polysilicon and so on, or a not shown current detection portion for simulating operations of the transistor portion provided in the active portion 120.

The semiconductor device 100 of this example includes an edge termination structure portion 90 between the outer circumferential gate runner 130 and the end side 102. The edge termination structure portion 90 relaxes the electric field concentration on the upper surface side of the semiconductor substrate 10. The edge termination structure portion 90 has, for example, a guard ring, a field plate, a RESURF and a combination of these structures provided annularly enclosing the active portion 120.

Figure 2A:
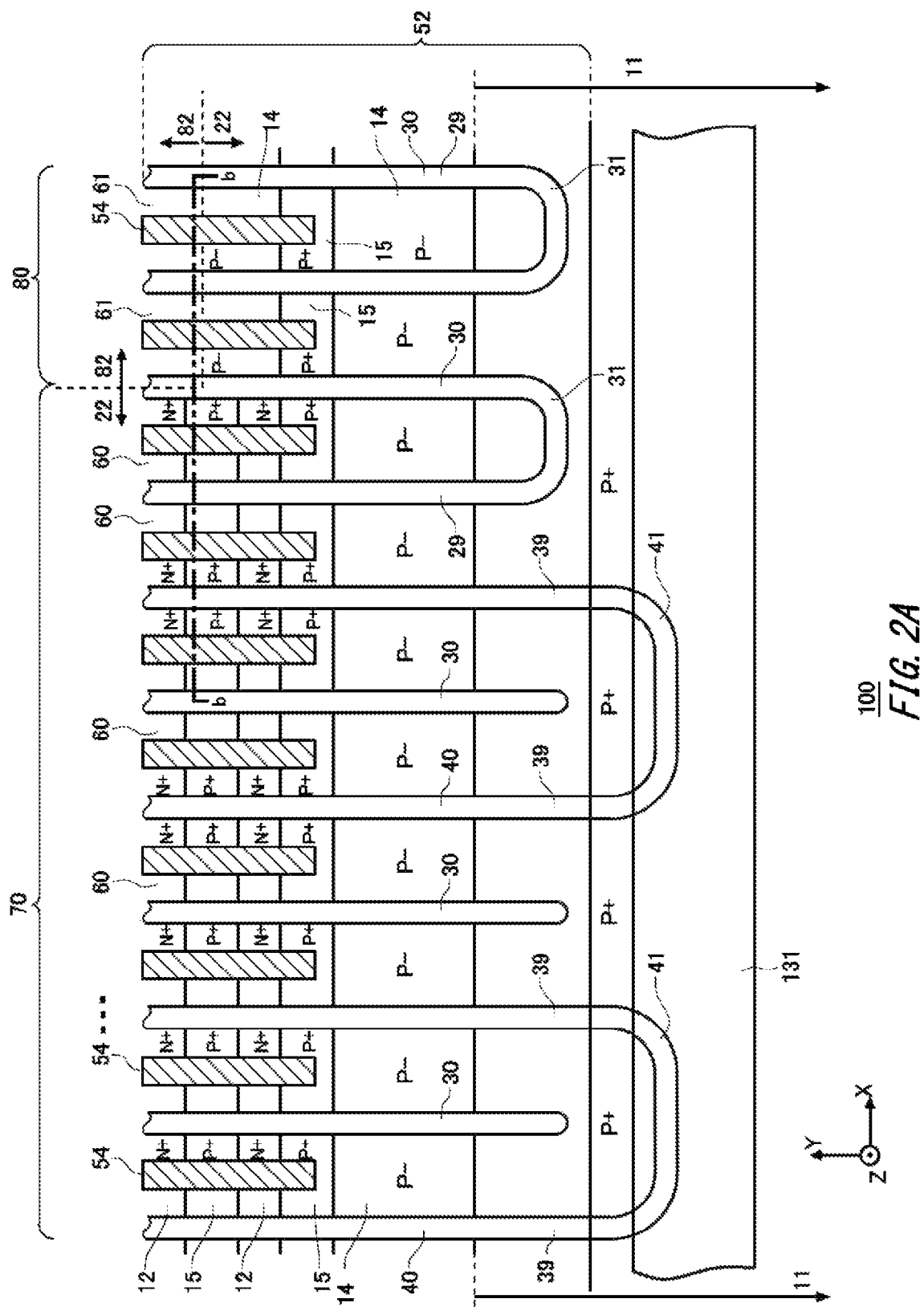
FIG. 2A illustrates an enlarged view of a region A in FIG. 1.

FIG. 2A illustrates an enlarged view of the region A in FIG. 1. The region A is a region including the transistor portion 70, the diode portion 80 and the active side gate runner 131. In the semiconductor substrate 10 of this example, a gate trench portion 40, a dummy trench portion 30, a well region 11, an emitter region 12, a base region 14 and a contact region 15 are provided in contact with the upper surface of the semiconductor substrate 10. Also, in the semiconductor substrate 10 of this example, a cathode region 82 and a collector region 22 are provided in contact with the lower surface of the semiconductor substrate 10.

Also, an emitter electrode 52 and an active side gate runner 131 are provided above the semiconductor substrate 10. The emitter electrode 52 is in contact with the emitter region 12, the contact region 15 and the base region 14 on the upper surface of the semiconductor substrate 10. Also, the emitter electrode 52 is connected with the dummy conductive portion of the dummy trench portion 30. An interlayer dielectric film may also be provided between the emitter electrode 52 and the semiconductor substrate 10.

Contact holes for connecting the emitter electrode 52 and the semiconductor substrate 10 may be provided on the interlayer dielectric film.

An insulating film such as a thermal oxide film is provided between the active side gate runner 131 and the semiconductor substrate 10. The active side gate runner 131 is connected with the gate conductive portion inside the gate trench portion 40 on the upper surface of the semiconductor substrate 10. The active side gate runner 131 is not connected with the dummy conductive portion inside the dummy trench portion 30. The gate trench portion 40 is provided extending in the Y axis direction to the bottom of the gate runner of the active side gate runner 131 and so on. The gate conductive portion of the gate trench portion 40 is connected with the gate runner.

The well region 11 is provided below the active side gate runner 131. The well region 11 is a region with a higher doping concentration than the base region 14, which is formed in contact with the upper surface of the semiconductor substrate 10, and is formed to a position deeper than the bottom portion of the base region 14. The width of the well region 11 in the Y axis direction may be larger than the width of the active side gate runner 131 in the Y axis direction.

A gate trench portion 40 is provided in the transistor portion 70. A dummy trench portion 30 is provided in the diode portion 80. A dummy trench portion 30 may also be provided in the transistor portion 70. The gate trench portion 40 functions as a gate electrode on which a gate potential is applied in the transistor portion 70. An emitter potential is applied on the dummy trench portion 30.

The gate trench portion 40 and the dummy trench portion 30 have longitudinal lengths in the Y axis direction in a top view. That is, the gate trench portion 40 and the dummy trench portion 30 are provided to extend in the Y axis direction. The gate trench portion 40 and the dummy trench portion 30 may have linear portions parallel to the Y axis direction.

Each trench portion of the gate trench portions 40 and the dummy trench portions 30 are arranged with a predetermined interval in the X axis direction. It is noted that the array patterns of the gate trench portion 40 and the dummy trench portion 30 are not limited to the example of FIG. 2A. The group of one or more gate trench portions 40 and the group of one or more dummy trench portions 30 may be alternately arranged along the X axis direction.

At least one trench portion may have the edges of the two linear portions connected by the curve-shaped edge portion. In the example of FIG. 2A, the gate trench portion 40 has two linear portions 39 and one edge portion 41. Also, the dummy trench portion 30 may also similarly have two linear portions 29 and one edge portion 31. The dummy trench portion 30 may also only have a linear portion. The respective edges of the trench portions in the Y axis direction may be arranged in the interior of the well region 11. In this way, the electric field concentration at the edges of the trench portions can be relaxed.

In this specification, in the X axis direction, the region of the semiconductor substrate 10 sandwiched by two linear portions of the trench portion may be referred to as a mesa portion. The mesa portion 60 is provided in the transistor portion 70, and the mesa portion 61 is provided in the diode portion 80. The mesa portion is a region in the portions of the semiconductor substrate 10 sandwiched by the trench portions on the upper surface side deeper than the deepest bottom portion of the trench portion.

A P− type base region 14 is provided in each mesa portion. The base region 14 is exposed on a part of the upper surface of the mesa portion. Contact regions 15 and emitter regions 12 are provided on the upper surface of the base region 14 of the transistor portion 70. The contact regions 15 of this example are of a P+ type with a higher doping concentration than the base region 14. The emitter regions 12 of this example are of an N+ type with a higher doping concentration than the drift region described below.

The emitter regions 12 are provided in contact with the gate trench portion 40 on the upper surface of the semiconductor substrate 10. The emitter regions 12 and the contact regions 15 of this example are provided from one trench portion sandwiching the mesa portion 60 to the other trench portion. The contact regions 15 and the emitter regions 12 are arranged alternately along the Y axis direction on the upper surface of the mesa portion 60 of this example.

In another example, the contact regions 15 and the emitter regions 12 may also be provided in a striped pattern along the Y axis direction in the mesa portion 60. For example, the emitter regions 12 are provided in the region adjacent to the trench portion, and the contact regions 15 are provided in the region sandwiched by the emitter regions 12. On the upper surface of the mesa portion 60, the base regions 14 may be arranged to sandwich the region where the contact regions 15 and the emitter regions 12 are provided in the Y axis direction.

The emitter regions 12 may not be provided in the mesa portion 61 of the diode portion 80. The base region 14 is provided on the upper surface of the mesa portion 61 of this example. The base region 14 may occupy a half or more of the area of the upper surface of the mesa portion 61. The contact regions 15 may be arranged on the upper surface of the mesa portion 61. The contact region 15 of the mesa portion 61 may be provided in the position overlapping the end of the trench contact 54 in the Y axis direction. The base regions 14 may be provided to sandwich the contact region 15 in the Y axis direction on the upper surface of the mesa portion 61.

In each of the mesa portions 60 and mesa portions 61, a trench contact 54 is provided. The trench contact 54 includes a contact trench (groove portion) formed from the upper surface of the semiconductor substrate 10 to the interior of the semiconductor substrate 10, and a conductive portion filled inside the trench. The conductive portion may be formed of the same material as the emitter electrode 52 continuously with the emitter electrode 52, may also be formed of a different material from the emitter electrode 52.

The trench contact 54 penetrates the contact regions 15 in the depth direction (the Z axis direction). That is, by providing the trench contact 54, the volume of the contact regions 15 is reduced. In this way, when the gate of the transistor portion 70 is turned to be in the off-state and diode operations start, the hole injection from the contact regions 15 can be suppressed. Therefore, the reverse recovery loss in the diode portion 80 can be reduced.

Also, by providing the trench contact 54, the contact area between the conductive portion and the semiconductor substrate 10 can be increased. Therefore, even if the widths in the X axis direction of the mesa portion 60 and the mesa portion 61 are miniaturized, increase in the contact resistance between the emitter electrode 52 and the semiconductor substrate 10 can be suppressed.

The width of the trench contact 54 in the X axis direction is less than the width in the X axis direction of each mesa portion. The both ends of the trench contact 54 in the Y axis direction may be provided in the contact regions 15 arranged in the both ends in the Y axis direction among the contact regions 15 of each mesa portion.

The lengths of the trench contact 54 provided in the mesa portion 60 and the trench contact 54 provided in the mesa portion 61 may be the same in the Y axis direction, or may be different. In the mesa portion 60, the trench contact 54 is provided above each region of the contact regions 15 and the emitter regions 12. The contact regions 15 and the emitter regions 12 may be arranged in the range where the trench contact 54 is provided. The trench contact 54 of this example is not provided in the regions corresponding to the base region 14 and the well region 11 of the mesa portion 60. In the mesa portion 61, the trench contact 54 is provided above the contact regions 15 and the base region 14. However, the trench contact 54 is not provided above the base region 14 that is sandwiched by the contact regions 15 and the well region 11 in the mesa portion 61.

In the diode portion 80, an N+ type cathode region 82 is provided in the region in contact with the lower surface of the semiconductor substrate 10. In the region where a cathode region 82 is not provided in the region in contact with the lower surface of the semiconductor substrate 10, a collector region 22 is provided. In the Y axis direction, the cathode region 82 is arranged away from the well region 11. At least one of the base region 14 and the contact regions 15 may be arranged between the cathode region 82 and the well region 11 in a top view. In this example, the distance in the Y axis direction between the cathode region 82 and the well region 11 is greater than the distance in the Y axis direction between the trench contact 54 and the well region 11.

Figure 2B:
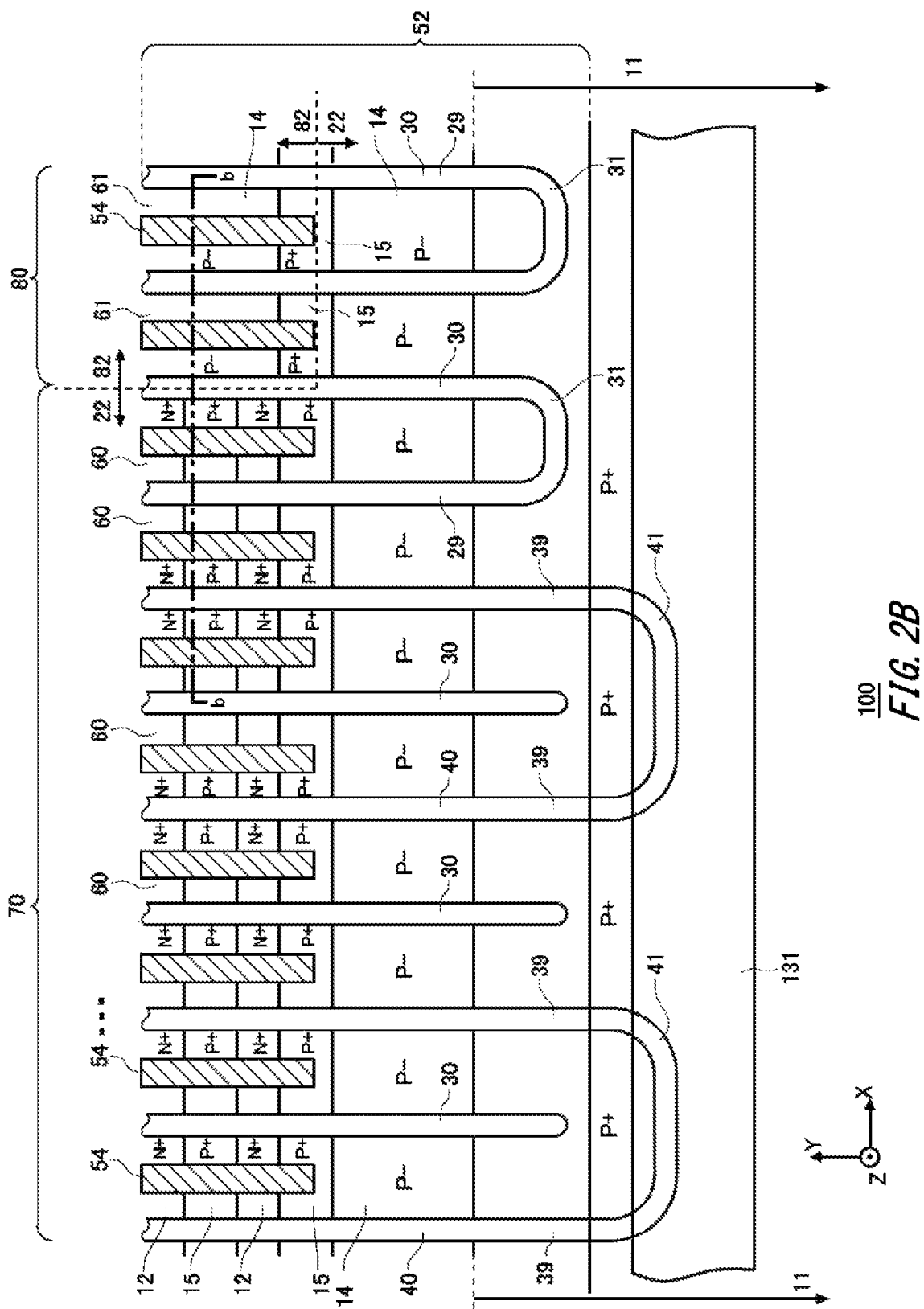
FIG. 2B illustrates another exemplary arrangement of a cathode region 82 in a top view.

FIG. 2B illustrates another exemplary arrangement of the cathode region 82 in a top view. In the cathode region 82 of this example, the position of the end in the Y axis direction matches the position of the end of the trench contact 54. Since the extraction of a carrier becomes easy by providing the trench contact 54, even if the cathode region 82 is arranged closer to the well region 11, the breakdown voltage becomes easy to secure.

The position of the end in the Y axis direction of the cathode region 82 may also not match the position of the end of the trench contact 54. The end in the Y axis direction of the cathode region 82 may be provided in the position overlapping the contact regions 15. The end in the Y axis direction of the cathode region 82 may also be arranged between the trench contact 54 and the well region 11.

Figure 3:
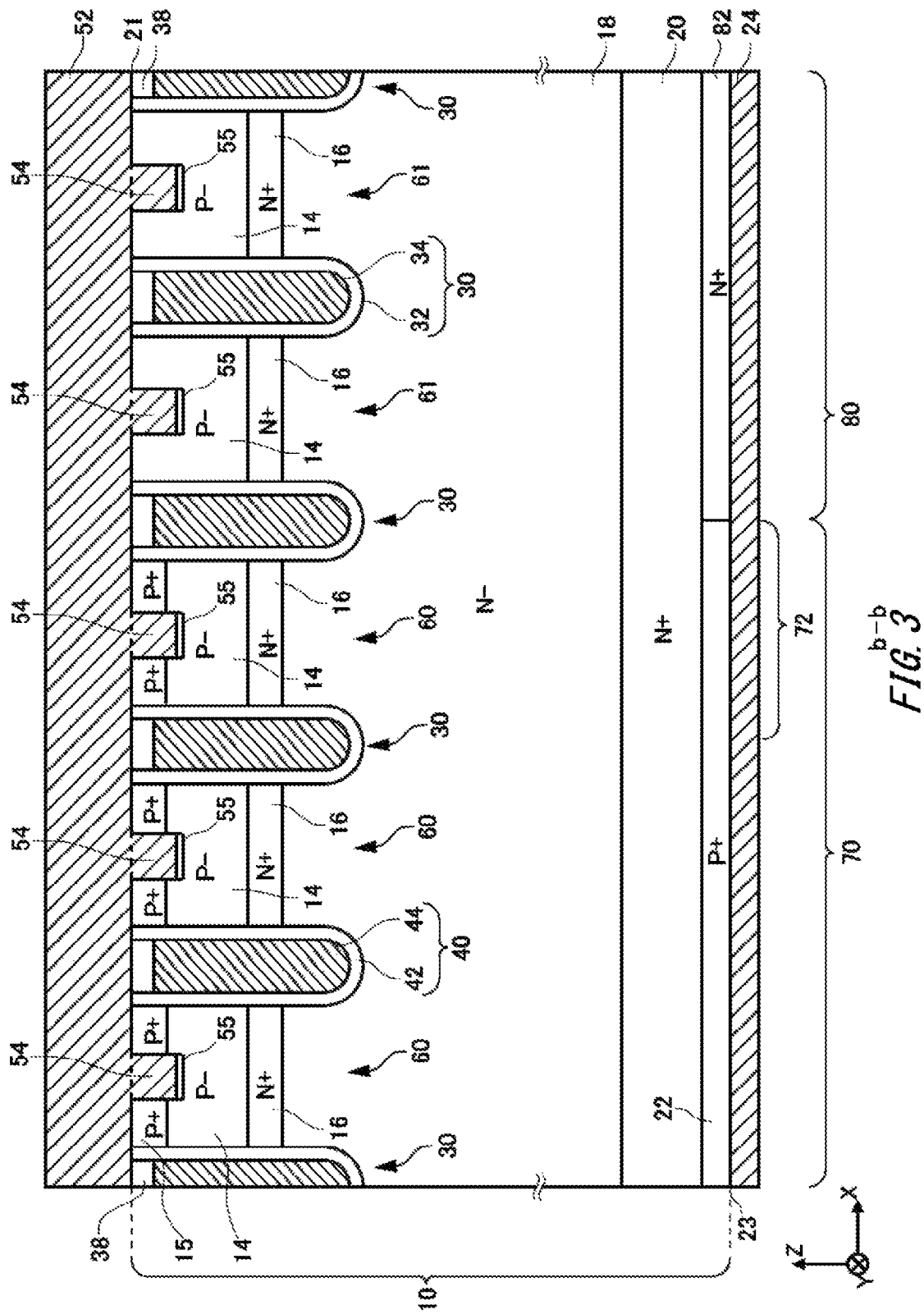
FIG. 3 illustrates one example of a b-b cross section in FIG. 2A and FIG. 2B.

FIG. 3 illustrates one example of the b-b cross section in FIG. 2A and FIG. 2B. The b-b cross section is the XZ plane crossing the contact regions 15. The semiconductor device 100 of this example has a semiconductor substrate 10, an emitter electrode 52 and a collector electrode 24 in the cross section.

The emitter electrode 52 may be in contact with the upper surface 21 of the semiconductor substrate 10 in each mesa portion. That is, an insulating film is not provided between each mesa portion and the emitter electrode 52. The insulating film is embedded in the trench portion without extending directly above each mesa portion. The emitter electrode 52 may be in contact with the upper surface 21 in the range including a plurality of mesa portions and a plurality of trench portions. According to such a configuration, even if the width in the X axis direction of the mesa portion is miniaturized, the contact area between the mesa portion and the emitter electrode 52 can be secured.

The collector electrode 24 may be provided throughout the lower surface 23 of the semiconductor substrate 10. The collector electrode 24 and the emitter electrode 52 may be formed of metallic materials such as aluminum.

The P− type base regions 14 are provided on the upper surface 21 side of the semiconductor substrate 10 of the cross section. In the cross section, on the upper surface 21 side of the semiconductor substrate 10 in the transistor portion 70, the P+ type contact regions 15 and the P− type base regions 14 are sequentially provided from the upper surface 21 of the semiconductor substrate 10. In the cross section, the P− type base regions 14 are provided on the upper surface 21 side of the semiconductor substrate 10 in the diode portion 80.

In each mesa portion, between the base region 14 and the drift region 18, an N+ type accumulation region 16 may be provided with a higher doping concentration than the drift region 18. The accumulation region 16 may also not be provided in the mesa portion 61. By providing the accumulation region 16, the carrier Injection-Enhancement effect (IE effect) can be improved, and the on-voltage of the transistor portion 70 can be reduced.

In the transistor portion 70 and the diode portion 80, an N− type drift region 18 is provided below the base region 14. In the transistor portion 70 and the diode portion 80, an N+ type buffer region 20 is provided below the drift region 18.

The doping concentration of the buffer region 20 is higher than the doping concentration of the drift region 18. The buffer region 20 may function as a field stop layer that prevents the depletion layer expanding from the lower surface of the base region 14 from reaching the collector region 22 and the cathode region 82.

In the transistor portion 70, a P+ type collector region 22 is provided below the buffer region 20. In the diode portion 80, an cathode region 82 is provided below the buffer region 20.

On the upper surface 21 side of the semiconductor substrate 10, one or more gate trench portions 40 and one or more dummy trench portions 30 are provided. Each trench portion is provided to reach the drift region 18 by penetrating the base region 14 from the upper surface 21 of the semiconductor substrate 10. In the region where at least any of the emitter region 12, the contact region 15 and the accumulation region 16 is provided, each trench portion reaches the drift region 18 by penetrating these regions. The trench portion penetrating the doping region is not limited to those produced in the order, in which the doping region is formed and then the trench portion is formed. A doping region formed between the trench portions after the formation of the trench portions is also included in the trench portions penetrating the doping region.

The gate trench portion 40 has a gate insulating film 42 and a gate conductive portion 44 provided on the upper surface 21 side of the semiconductor substrate 10. The gate insulating film 42 is provided to cover the inner wall of the gate trench portion 40. The gate insulating film 42 may be formed of oxidizing or nitrifying the semiconductor on the inner wall of the gate trench portion 40. The gate conductive portion 44 is provided inside the gate insulating film 42 in the interior of the gate trench portion 40. That is, the gate insulating film 42 insulates the gate conductive portion 44 from the semiconductor substrate 10. The gate conductive portion 44 is formed of conductive materials such as polysilicon.

The gate conductive portion 44 includes a region opposite the base region 14 sandwiching the gate insulating film 42. The gate conductive portion 44 is insulated from the emitter electrode 52 by the interlayer dielectric film 38. The interlayer dielectric film 38 is, for example, a silicate glass, such as PSG or PB SG. At least a part of the interlayer dielectric film 38 may be provided in the interior of the gate trench. At least a part of the interlayer dielectric film 38 may also be provided above the upper surface 21 of the semiconductor substrate 10. When a predetermined voltage is applied to the gate conductive portion 44, a channel with an inverted layer of electrons is formed on the surface layer of the interface in contact with the gate trench of the base region 14.

In the cross section, the dummy trench portions 30 may have the same structure as the gate trench portion 40. The dummy trench portions 30 has a dummy trench, a dummy insulating film 32 and a dummy conductive portion 34 provided on the upper surface 21 side of the semiconductor substrate 10. The dummy insulating film 32 is provided to cover the inner wall of the dummy trench. The dummy conductive portion 34 is provided in the interior of the dummy trench, and is provided inside the dummy insulating film 32. The dummy insulating film 32 insulates the dummy conductive portion 34 from the semiconductor substrate 10. The dummy conductive portion 34 may be formed of the same materials as the gate conductive portion 44. In the cross section, the dummy conductive portion 34 may be insulated from the emitter electrode 52 by the interlayer dielectric film 38. In a cross section different from that in FIG. 3, the dummy conductive portion 34 may be connected to the emitter electrode 52 by the contact holes provided on the interlayer dielectric film 38 and so on. At least a part of the interlayer dielectric film 38 may be provided in the interior of the dummy trench. At least a part of the interlayer dielectric film 38 may also be provided above the upper surface 21 of the semiconductor substrate 10.

In at least one mesa portion, the trench contact 54 of a conductive material is provided. The trench contact 54 may be formed of the same material as emitter electrode 52, or may be formed of materials such as tungsten. By forming the trench contact 54 by materials including tungsten, a fine trench contact 54 can be easily formed. The trench contact 54 is connected to the emitter electrode 52.

The trench contact 54 is provided to penetrate the contact region 15. That is, the trench contact 54 is provided from the upper surface 21 of the semiconductor substrate 10, to the position reaching the base region 14. The lower end of the trench contact 54 may be in the same position as the lower end of the base region 14, may also be arranged lower than the lower end of the base region 14. The trench contact 54 may penetrate the emitter regions 12 in the cross section different from FIG. 3.

As described above, since the trench contact 54 penetrates the contact regions 15, the contact region 15 becomes small. Therefore, the hole injection from the contact regions 15 to the drift region 18 side can be suppressed.

In the region in contact with the bottom portion of the trench contact 54, a P++ type high-concentration plug region 55 with a higher doping concentration than the contact region 15 is provided. The high-concentration plug region 55 may cover the entire of the bottom surface of the trench contact 54. The doping concentration of the high-concentration plug region 55 may be twice or more of the doping concentration of the contact region 15, may be five times or more, or may be ten times or more. By providing the high-concentration plug region 55, the contact resistance between the trench contact 54 and the semiconductor substrate 10 can be reduced. Also, the extraction of a hole from the semiconductor substrate 10 becomes easy by the high-concentration plug region 55 and the trench contact 54. Therefore, the reverse recovery loss can be further reduced. The thickness of the high-concentration plug region 55 in the depth direction is preferably less than the thickness in the depth direction of the contact regions 15.

The transistor portion 70 may have a boundary portion 72 in contact with the diode portion 80. The boundary portion 72 includes one or more mesa portions 60. The mesa portion 60 of the boundary portion 72 may have the same configuration as the mesa portion 60 outside the boundary portion 72.

The trench contact 54 and the high-concentration plug region 55 may be provided in the mesa portion 60 of the boundary portion 72. In this way, the holes flowing from the contact region 15 of the boundary portion 72 to the diode portion 80 can be reduced. The trench contact 54 and the high-concentration plug region 55 may be provided only in the boundary portion 72, may also be provided outside the boundary portion 72.

The trench contact 54 and the high-concentration plug region 55 may also be provided in the mesa portion 60 outside the boundary portion 72. The trench contacts 54 and the high-concentration plug regions 55 may be provided in all of the mesa portions 60 of the transistor portion 70. The trench contacts 54 and the high-concentration plug regions 55 may also be provided in all of the mesa portions 60 having the contact regions 15 and the emitter regions 12. In this way, the holes flowing from the entire transistor portion 70 to the diode portion 80 can be reduced.

The trench contact 54 and the high-concentration plug region 55 may also be provided in the diode portion 80. The trench contacts 54 and the high-concentration plug regions 55 may also be provided in all of the mesa portions 61 of the diode portion 80. The trench contact 54 provided in the mesa portion 61 may be formed with the same depth as the trench contact 54 provided in the mesa portion 60, or may be formed with a different depth. In the mesa portion 61, the trench contact 54 may also penetrate the contact region 15.

Figure 4:
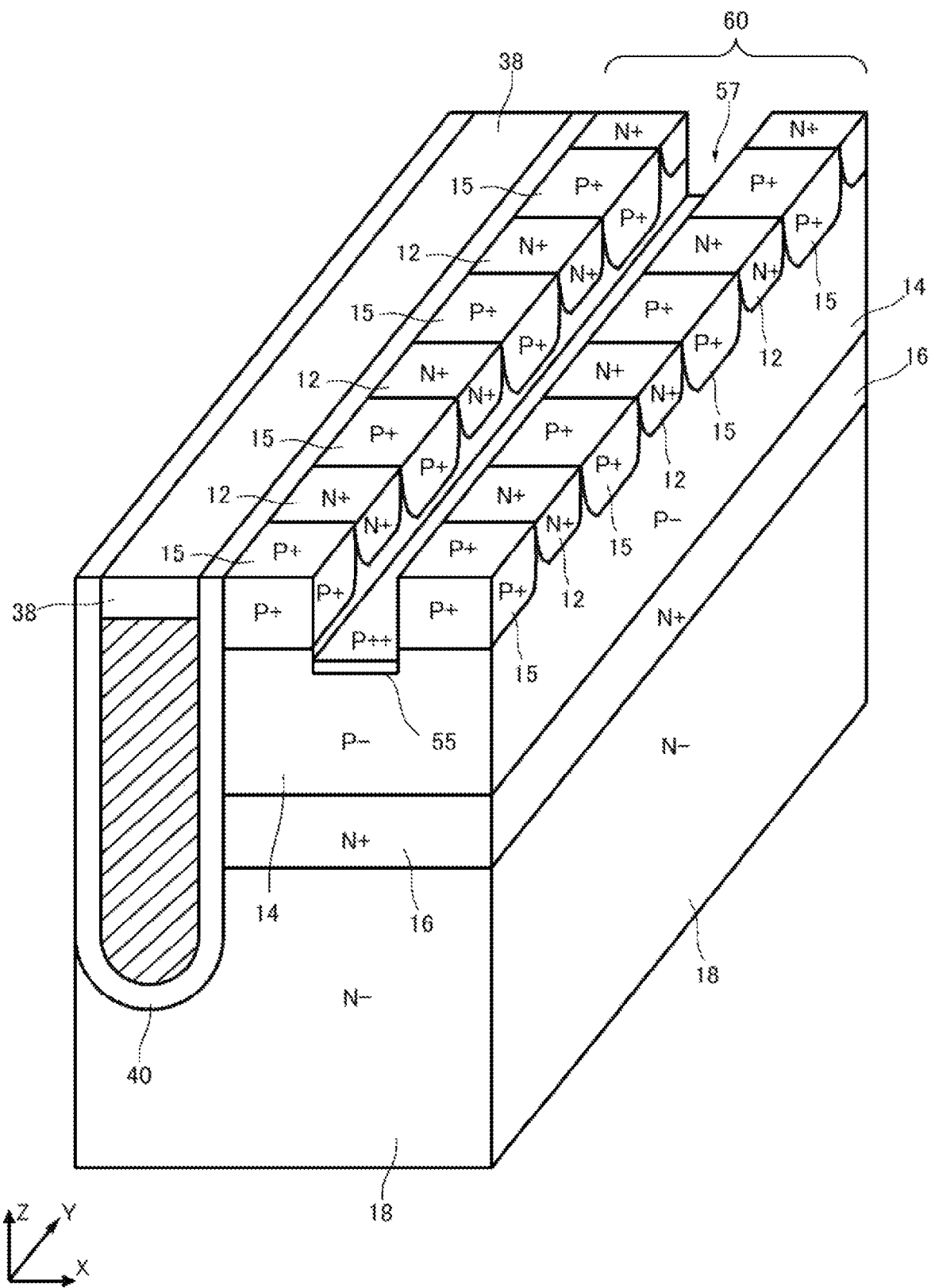
FIG. 4 illustrates a perspective cross-sectional view showing an exemplary structure of a mesa portion 60.

FIG. 4 illustrates a perspective cross-sectional view showing the exemplary structure of the mesa portion 60. In FIG. 4, of the trench contacts 54, the contact trench 57 is shown, and the conductive material filled in the contact trench 57 is omitted.

In this example, the contact region 15 is provided in a position deeper than the emitter region 12. As shown in FIG. 4, the contact trench 57 is provided to penetrate the contact regions 15 and the emitter regions 12. When the emitter region 12 is provided in a position deeper than the contact region 15, the contact trench 57 may be provided to a position deeper than the lower end of the emitter regions 12, or may be provided to a position shallower than the lower end of the emitter regions 12.

In the bottom portion of the contact trench 57, a P++ type high-concentration plug region 55 is provided. The contact regions 15, the emitter regions 12 and the base region 14 may be exposed from the sides of the contact trench 57. The high-concentration plug region 55 may be exposed from the bottom surface of the contact trench 57. The trench contact 54 may contact the contact regions 15, the emitter regions 12, the base region 14 and the high-concentration plug region 55.

Figure 5:
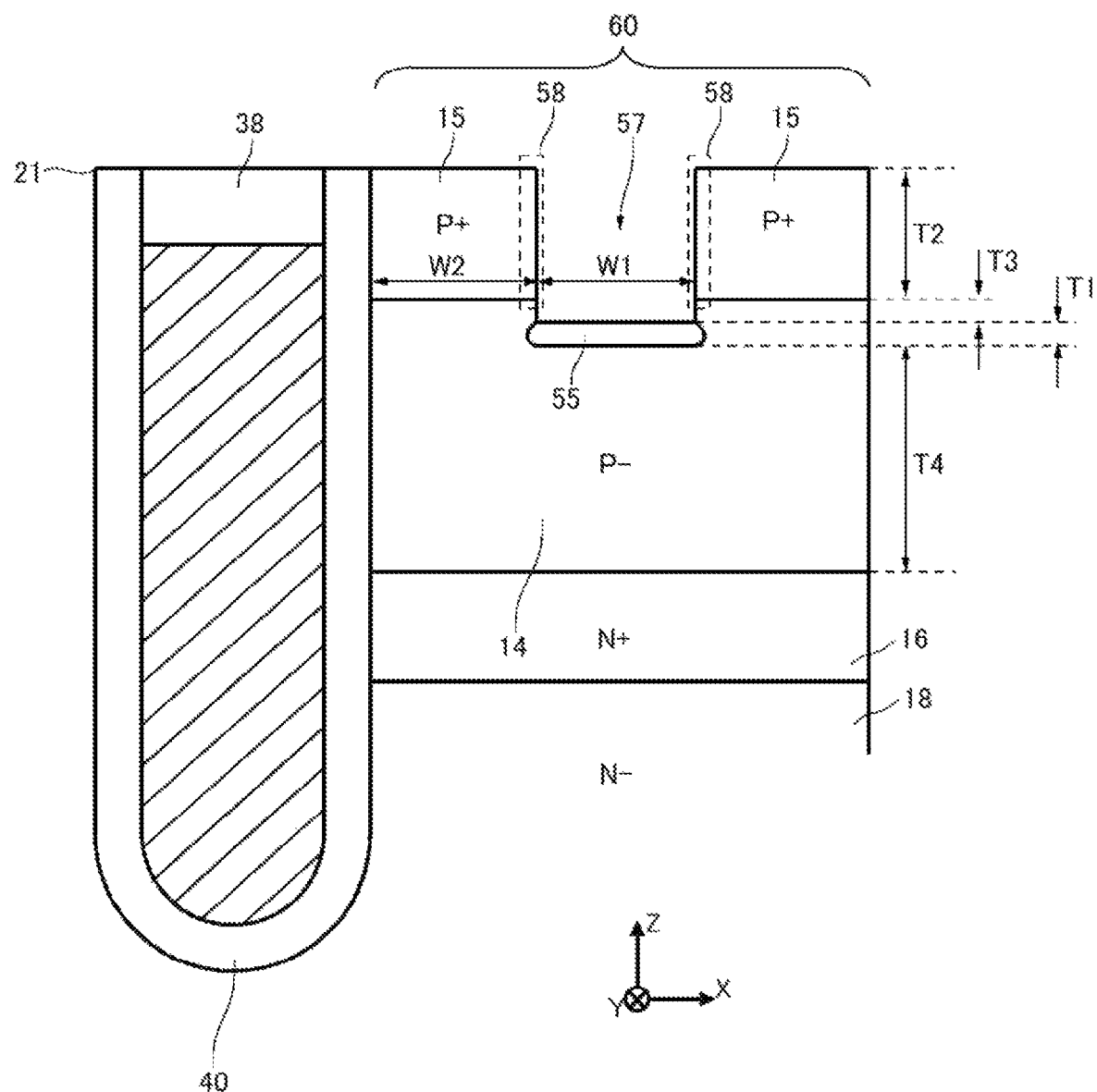
FIG. 5 illustrates a cross sectional view showing an exemplary structure of the mesa portion 60.

FIG. 5 illustrates a cross sectional view showing an exemplary structure of the mesa portion 60. In this example, in the depth direction of the semiconductor substrate 10, the thickness of the high-concentration plug region 55 is referred to as T1, the thickness of the contact region 15 is referred to as T2, the protruding length of the contact trench 57 protruding below the lower end of the contact region 15 is referred to as T3, and the thickness of the base region 14 below the high-concentration plug region 55 is referred to as T4. The thickness or length of each member may use the maximum value of the thickness or length of each member.

In this example, the thickness T1 of the high-concentration plug region 55 may be less than the thickness T2 of the contact region 15. The thickness T1 may be a half or less, may be ¼ or less, or may be 1/10 or less of the thickness T2. In this way, the injection of the holes from the high-concentration plug region 55 can be suppressed. The product of the thickness T1 of the high-concentration plug region 55 and the doping concentration may be less than the product of the thickness T2 of the contact regions 15 and the doping concentration.

It is noted that the lower end of the high-concentration plug region 55 is provided above the lower end of the base region 14. That is, the high-concentration plug region 55 is arranged inside the base region 14, and not in contact with the accumulation region 16 or the drift region 18. In this way, the trench contact 54 can be prevented from connecting to N type regions via the high-concentration plug region 55.

The protruding length T3 of the contact trench 57 is less than the thickness T4 of the base region 14. When the protruding length T3 becomes large, the distance between the high-concentration plug region 55 and the drift region 18 (or the accumulation region 16) becomes less, and the breakdown voltage decreases. The protruding length T3 may be a half or less, may also be ¼ or less of the thickness T4.

Also, when the thickness T1 of the high-concentration plug region 55 becomes large, the distance between the high-concentration plug region 55 and the drift region 18 (or the accumulation region 16) becomes less, and the breakdown voltage decreases. The thickness T1 may be a half or less, may be ¼ or less, or may be 1/10 or less of the thickness T4.

Also, the width in the X axis direction of the contact trench 57 (that is, the width of the trench contact 54) is referred to as W1, and the distance in the X axis direction between the gate trench portion 40 and the contact trench 57 is referred to as W2. That is, the width W2 is the width of the contact regions 15. The width W1 may be a half or more, or may be once or more of the width W2. By enlarging the width W1, the hole injection from the contact regions 15 can be suppressed.

The high-concentration plug region 55 may be formed by implanting P type impurities from the upper of the upper surface 21 of the semiconductor substrate 10 toward the contact trench 57. In this case, the P type impurities are also implanted into the regions exposed from the sides of the contact trench 57 of the contact regions 15 and the emitter regions 12. In the contact regions 15, the impurity concentration of the boundary portion 58 in contact with the contact trench 57 may be higher than the impurity concentration of the region in contact with the gate trench portion 40. With such a configuration, the contact resistance between the trench contact 54 and the contact regions 15 can be further reduced. Also, in the emitter regions 12, the P type impurity concentration of the region in contact with the contact trench 57 may be higher than the P type impurity concentration of the region in contact with the gate trench portion 40. The region of the emitter regions 12 in contact with the contact trench 57 may also be inverted to P type.

It is noted that the width W2 is preferably to have a thickness to an extent that the P type impurities implanted from the contact trench 57 to the emitter region 12 does not reach the gate trench portion 40. The width W2 may be 0.2 μm or more, and may be 0.5 μm or more.

The step for forming the high-concentration plug region 55 is preferably a step after the steps for forming the emitter regions 12, the base region 14, the accumulation region 16, the contact regions 15 and each trench portion. In this way, the thermal history with respect to the high-concentration plug region 55 and the boundary portion 58 can be reduced. Accordingly, the thickness T1 of the high-concentration plug region 55 can be small, and the P type impurities implanted to the boundary portion 58 can be inhibited from reaching the gate trench portion 40.

Figure 6:
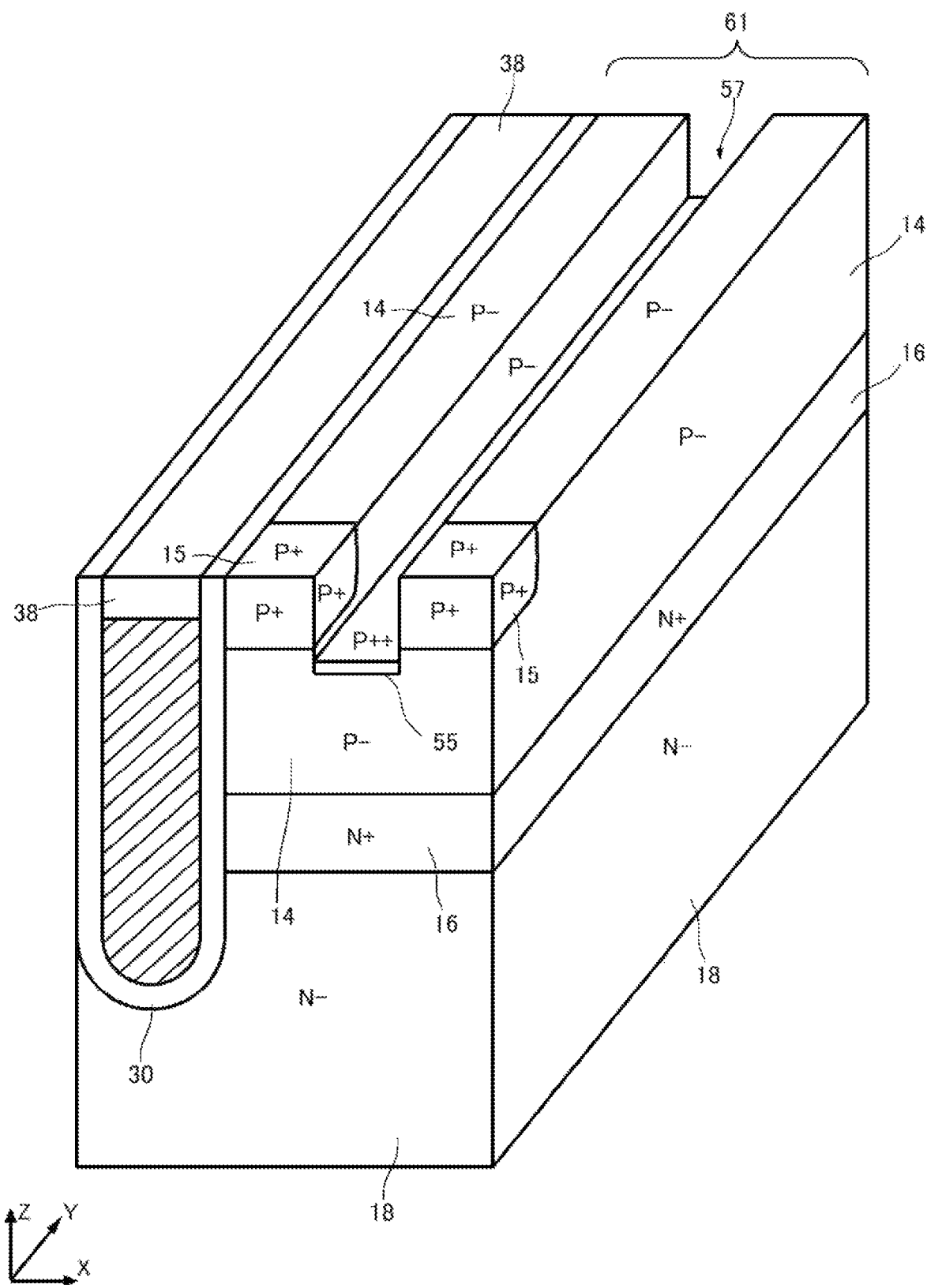
FIG. 6 illustrates a perspective cross-sectional view showing an exemplary structure of the mesa portion 61.

FIG. 6 illustrates a perspective cross-sectional view showing an exemplary structure of the mesa portion 61. In FIG. 6, of the trench contact 54, the contact trench 57 is shown, and the conductive material filled in the contact trench 57 is omitted.

As shown in FIG. 6, the contact trench 57 is provided from the upper surface 21 of the semiconductor substrate 10 to the interior of the base region 14. The contact trench 57 may penetrate the contact regions 15. A P++ type high-concentration plug region 55 is provided in the bottom portion of the contact trench 57. The contact regions 15 and the base region 14 may be exposed from the sides of the contact trench 57. The high-concentration plug region 55 may be exposed from the bottom surface of the contact trench 57. The trench contact 54 may contact the contact regions 15, the base region 14 and the high-concentration plug region 55.

Figure 7:
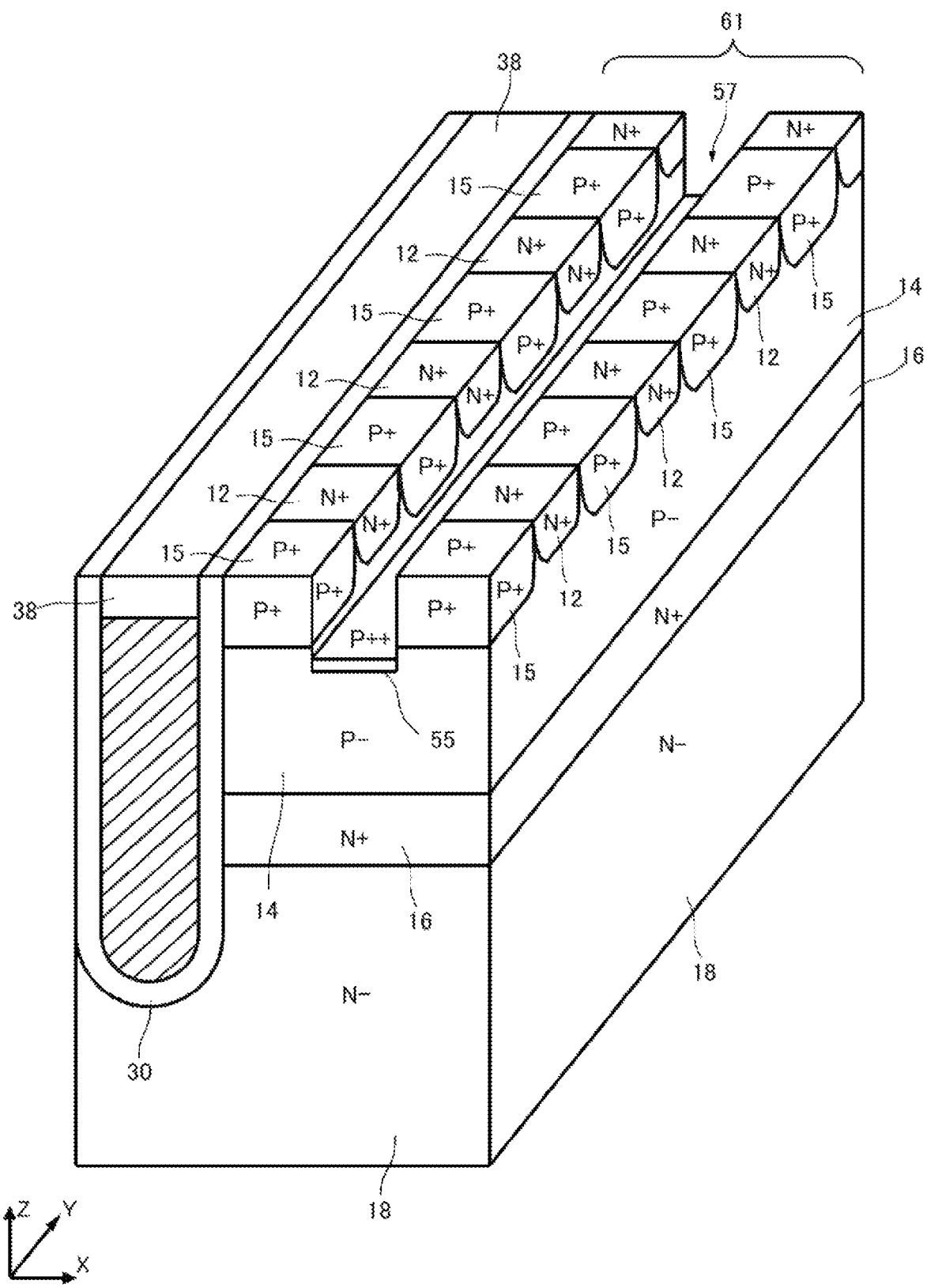
FIG. 7 illustrates a perspective cross-sectional view showing another exemplary structure of the mesa portion 61.

FIG. 7 illustrates a perspective cross-sectional view showing another exemplary structure of the mesa portion 61. The mesa portion 61 of this example on the upper surface 21 of the semiconductor substrate 10 has the same structure with the mesa portion 60. That is, in the mesa portion 61 of this example, the contact regions 15 and the emitter regions 12 are alternately arranged along the Y axis direction. Also in this case, the contact trench 57 may be provided to penetrate the contact regions 15 and the emitter regions 12 from the upper surface 21 of the semiconductor substrate 10 to the base region 14.

Figure 8:
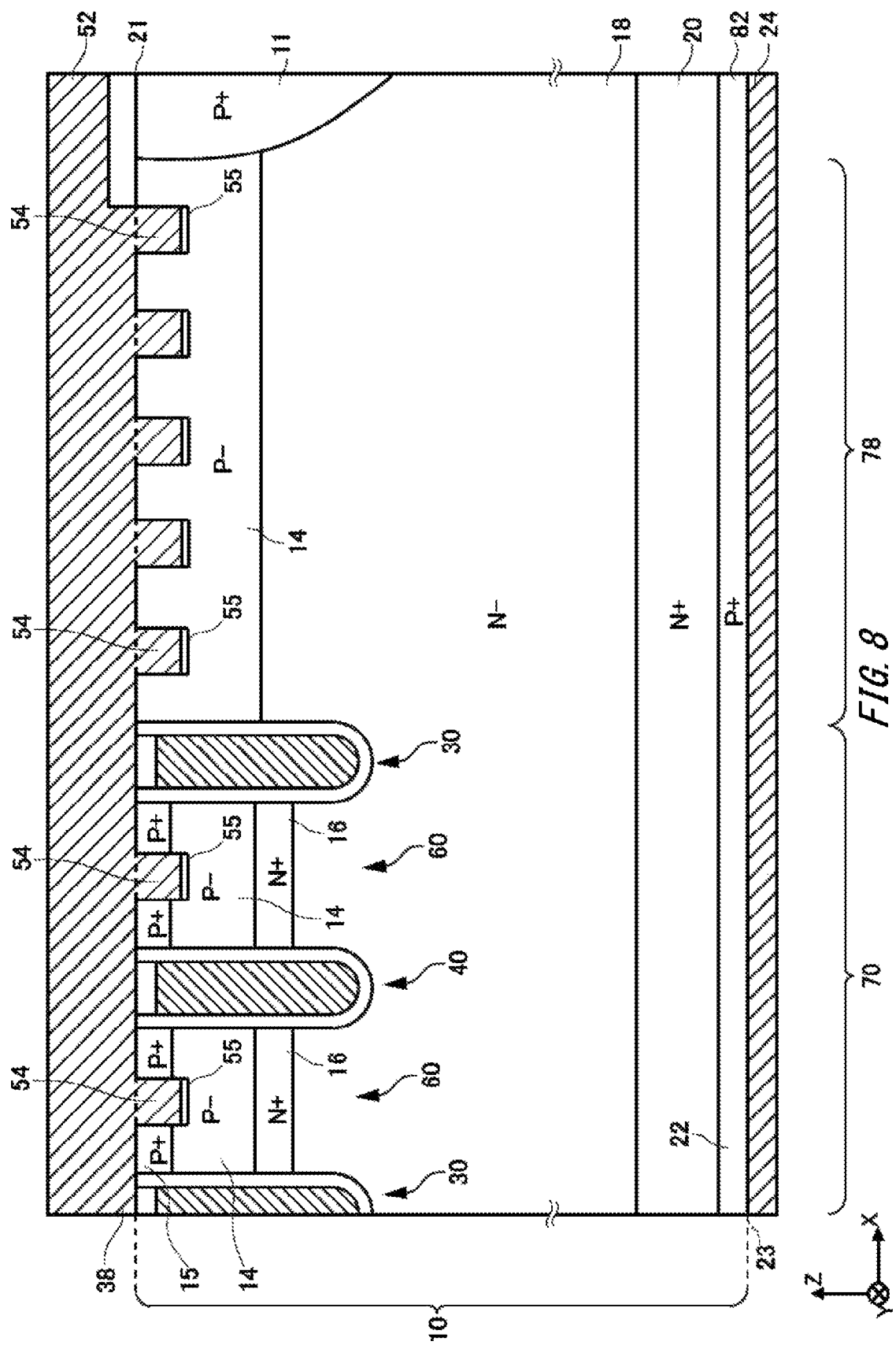
FIG. 8 illustrates a cross sectional view showing an exemplary structure of an end of an active portion 120 in the X axis direction.

FIG. 8 illustrates a cross sectional view showing an exemplary structure of the end of the active portion 120 in the X axis direction. The cross section in FIG. 8 is a XZ cross section. The active portion 120 of this example is enclosed by the well region 11 in a top view. An outer circumferential gate runner 130 is provided above the well region 11, but is omitted in FIG. 8.

The active portion 120 of this example has an end region 78 between the transistor portion 70 arranged at the most end in the X axis direction (or the diode portion 80) and the well region 11. In the end region 78, the gate trench portion 40 and the dummy trench portion 30 are not arranged. In the end region 78, the base region 14 may be exposed from the upper surface 21 of the semiconductor substrate 10.

In the end region 78, one or more pairs of the trench contacts 54 and the high-concentration plug regions 55 may be provided. In the end region 78 of this example, a plurality of pairs of trench contacts 54 and high-concentration plug regions 55 are arranged with even intervals along the X axis direction and the like. The trench contact 54 and the high-concentration plug region 55 in the end region 78 may have the same structures as the trench contact 54 and the high-concentration plug region 55 in the transistor portion 70. By providing the end region 78, the carrier of the hole and the like flowing from the regions outside the active portion 120 to the active portion 120 can be extracted. In this way, the concentration of the carriers in the mesa portion arranged at the end of the active portion 120 can be suppressed.

Figure 9:
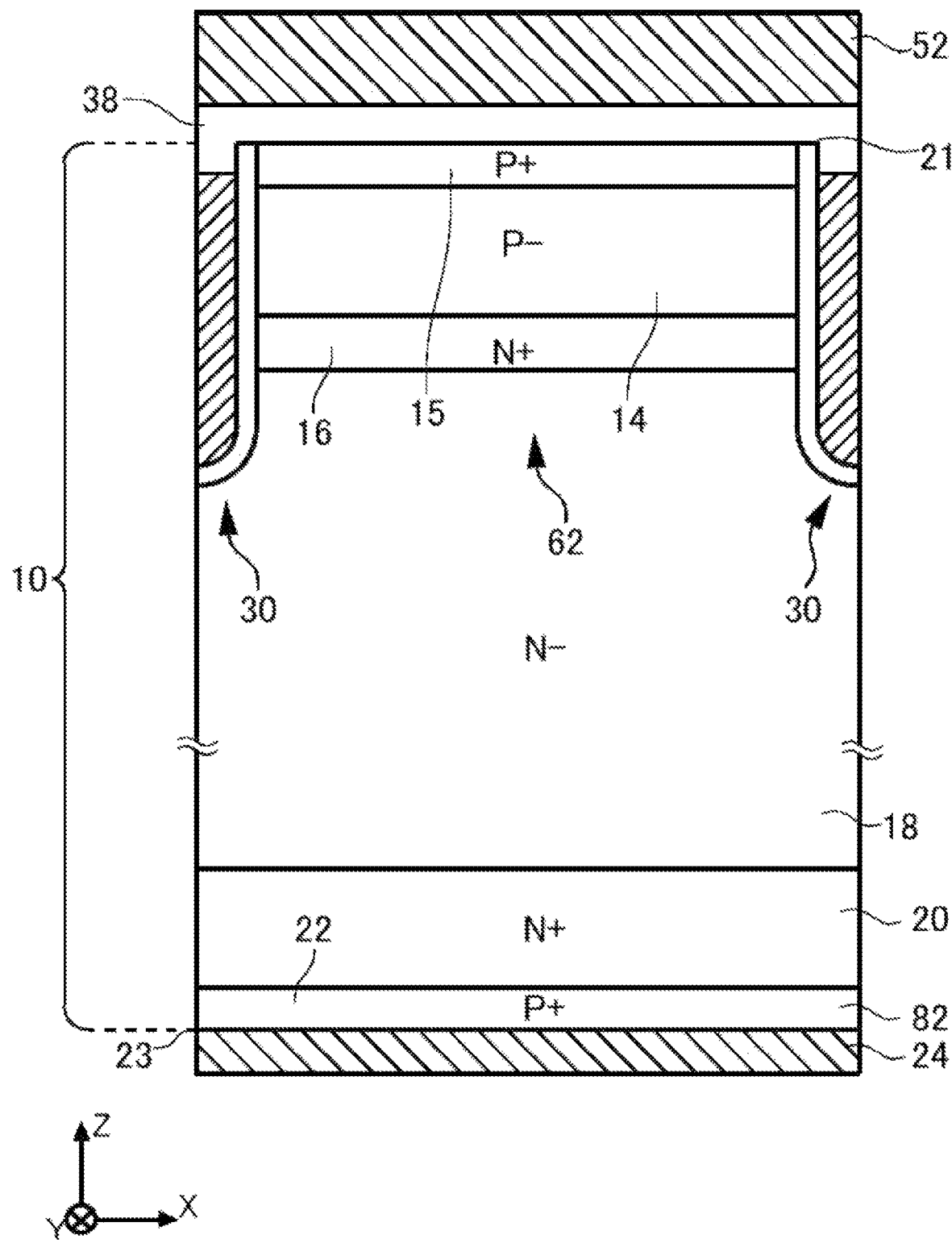
FIG. 9 illustrates a XZ cross-sectional view showing one example of the mesa portion 62 included in the semiconductor device 100.

FIG. 9 illustrates an XZ cross-sectional view showing one example of the mesa portion 62 included by the semiconductor device 100. The mesa portion 62 may be provided in the transistor portion 70 or the diode portion 80. The mesa portion 62 is a floating mesa that is electrically insulated from the emitter electrode 52 by the interlayer dielectric film 38. By providing the mesa portion 62, the carrier can be inhibited from being extracted by the emitter electrode 52, and the IE effect can be further improved. The trench contact 54 is not provided in the mesa portion 62.

Figure 10:
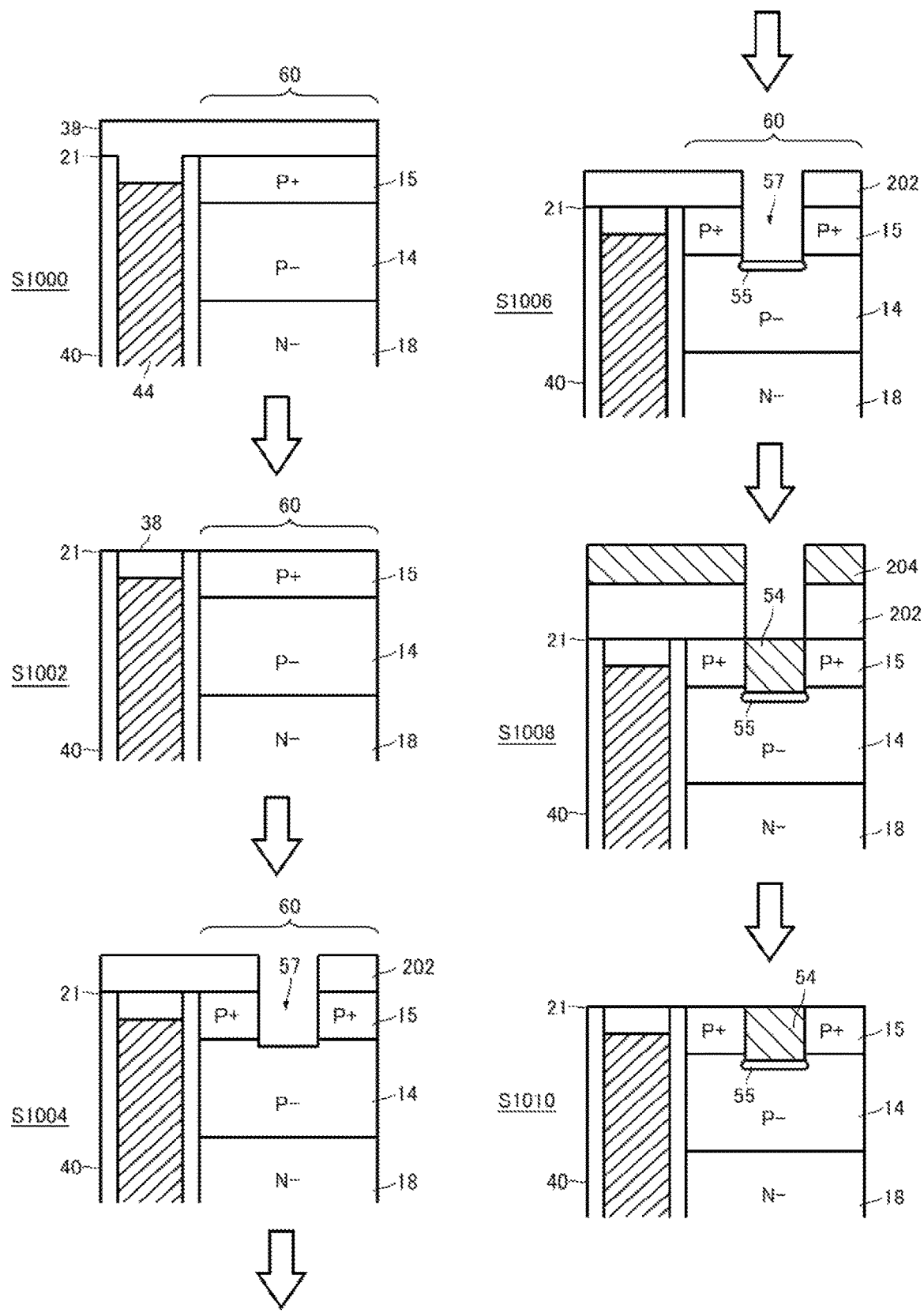
FIG. 10 illustrates a figure describing some steps of the production method of the semiconductor device 100.

FIG. 10 illustrates a figure describing a part of steps of the production method of the semiconductor device 100. In FIG. 10, the step for forming the trench contact is shown. In FIG. 10, the accumulation region 16 is omitted. Before forming the trench contact, the contact regions 15, the emitter regions 12, the base region 14, the gate trench portion 40 and the dummy trench portion 30 are formed in the semiconductor substrate 10. In this example, the upper end of the gate conductive portion 44 of the gate trench portion 40 and the upper end of the dummy conductive portion 34 of the dummy trench portion 30 are arranged lower than the upper surface 21 of the semiconductor substrate 10.

In S1000, an interlayer dielectric film 38 is formed on the upper of the conductive portion of each trench portion and the upper surface 21 of the semiconductor substrate 10. As mentioned above, since the conductive portion of each trench portion is arranged lower than the upper surface 21 of the semiconductor substrate 10, a part of the interlayer dielectric film 38 is also formed above the conductive portion inside each trench portion.

In S1002, the interlayer dielectric film 38 above the upper surface 21 of the semiconductor substrate 10 is removed by etching back. In this way, the interlayer dielectric film 38 in the interior of each trench portion remains, and the upper surfaces of the mesa portion 60 and the mesa portion 61 are exposed.

In S1004, a mask pattern 202 is formed on the upper surface 21 of the semiconductor substrate 10, and a contact trench 57 is formed by etching the upper surface 21 of the semiconductor substrate 10. The contact trench 57 penetrates the contact regions 15.

In S1006, the high-concentration plug region 55 is formed in contact with the bottom portion of the contact trench 57. The high-concentration plug region 55 may be formed by implanting P type impurities that are the same as the contact regions 15. Also, in S1006, the acceleration energy of the impurity ions may be less than the acceleration energy when the impurity ions are implanted into the contact regions 15. Also, in S1006, the heat treatment temperature may be lower than the heat treatment temperature when the contact regions 15 are formed. Also, in S1006, the heat treatment time may be shorter than the heat treatment time when the contact regions 15 are formed. Also, in S1006, the heat treatment may also be not performed.

As one example, the P type impurity is boron. As one example, when the contact regions 15 are formed, the accelerating voltage of the impurity ion may be from 100 keV to 140 keV. The implantation amount of the impurity ion may be from $1\times10^{15}$ (/cm$^2$) to $5\times10^{15}$ (/cm$^2$). The heat treatment temperature may be from 950° C. to 1100° C. The heat treatment time may be from 20 minutes to 40 minutes.

As one example, when the high-concentration plug region 55 is formed, the accelerating voltage of the impurity ion may be from 20 keV to 80 keV. The implantation amount of the impurity ion may be from $1\times10^{15}$ (/cm$^2$) to $5\times10^{15}$ (/cm$^2$). The implantation amount of the impurity ion when the high-concentration plug region 55 is formed may be less than the implantation amount of the impurity ion when the contact regions 15 are formed. However, since the thickness of the high-concentration plug region 55 is small, the doping concentration per unit volume becomes high. The heat treatment temperature may be from 800° C. to 900° C. The heat treatment time for forming the high-concentration plug region 55 may be a period of $\frac{1}{10}$ or less of the heat treatment time for forming the contact regions 15. The heat treatment time for forming the high-concentration plug region 55 may be from 5 seconds to 1 minute.

In S1008, the conductive material is formed in the interior of the contact trench 57. In this example, the conductive material 204 is also formed above the mask pattern 202. The conductive material formed in the interior of the contact trench 57 becomes the trench contact 54.

In S1010, the mask pattern 202 is removed. In this way, the trench contact 54 can be formed. After the formation of the trench contact 54, the emitter electrode 52 is formed on the upper surface 21 of the semiconductor substrate 10. When the trench contact 54 is formed of the same material as the emitter electrode 52, in S1008, the conductive material may be deposited after the mask pattern 202 being removed.

It is noted that after the formation of the high-concentration plug region 55, it is preferable that there is no process with higher temperature than the heat treatment temperature when the high-concentration plug region 55 has been formed. In this way, the thickness of the high-concentration plug region 55 can be controlled with high accuracy.

Figure 11:
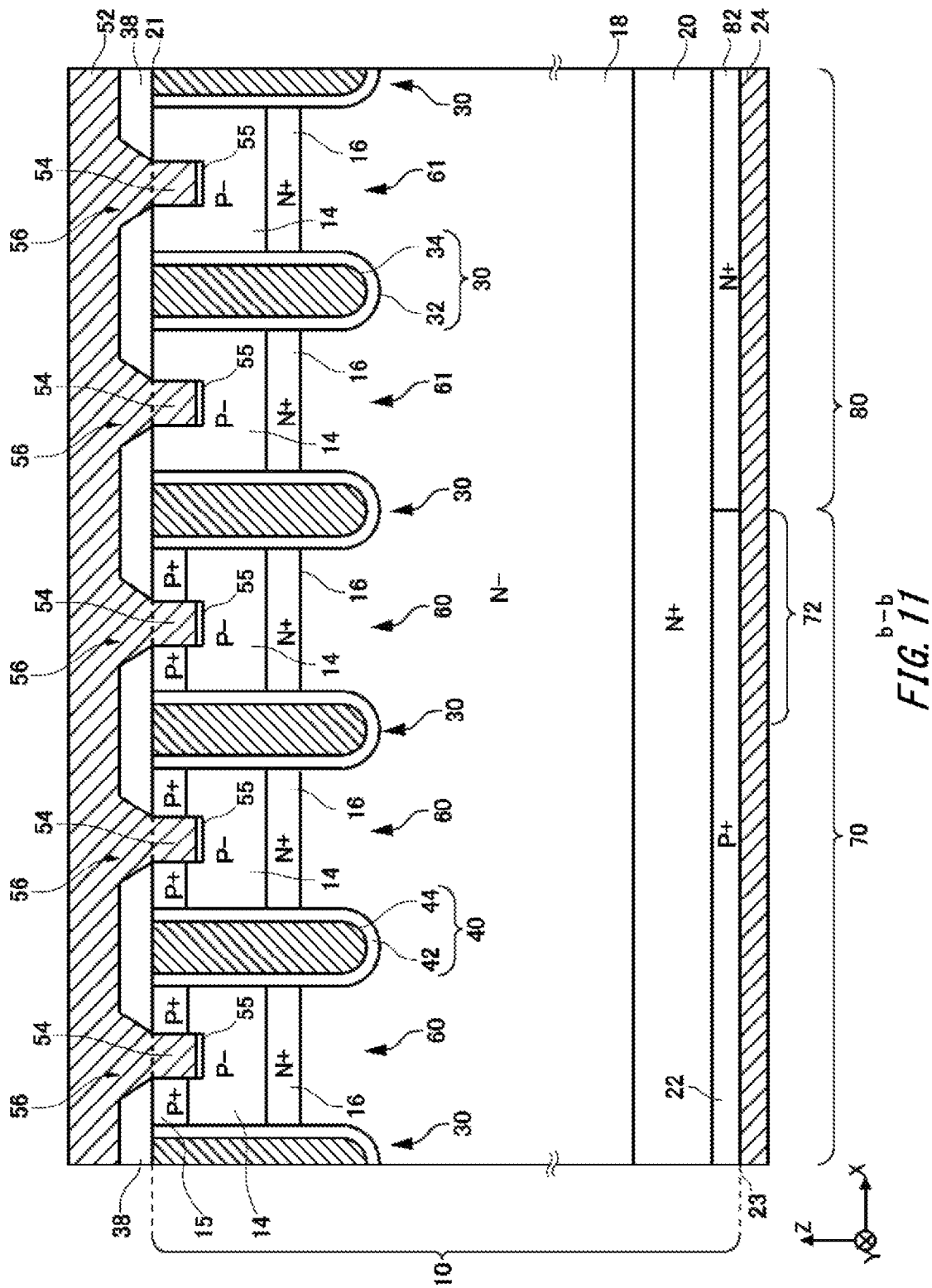
FIG. 11 illustrates another example of the b-b cross section in FIG. 2A and FIG. 2B.

FIG. 11 illustrates another example of the b-b cross section in FIG. 2A and FIG. 2B. In the semiconductor device 100 of this example, the structure of the interlayer dielectric film 38 is different from the example shown in FIG. 3. The other structures are the same as the example shown in FIG. 3.

In this example, the interlayer dielectric film 38 is provided above the upper surface 21 of the semiconductor substrate 10. The interlayer dielectric film 38 is provided to cover each trench portion. That is, the width in the X axis direction of the interlayer dielectric film 38 is greater than the width of the trench portion. The interlayer dielectric film 38 may be or may not be provided in the interior of each trench portion.

Each of the mesa portions 60 and the mesa portions 61 has a part that is not covered by the interlayer dielectric film 38. In the interlayer dielectric film 38, contact holes 56 may be provided to expose the mesa portions 60 and the mesa portions 61. The contact hole 56 may be provided to have a longitudinal length in the longitudinal direction (the Y axis direction) of each mesa portion 60.

The trench contacts 54 of this example is provided on the upper surfaces of the mesa portion 60 and the mesa portion 61 that are exposed by the contact holes 56. The trench contact 54 may be formed by etching the upper surface of the semiconductor substrate 10 using the interlayer dielectric film 38 provided with the contact holes 56 as the mask. In this case, on the upper surface 21 of the semiconductor substrate 10, the position of the opening part of the contact hole 56 matches the position of the trench contact 54. In another example, the position of the opening part of the contact hole 56 may be different from the position of the trench contact 54.

Figure 12:
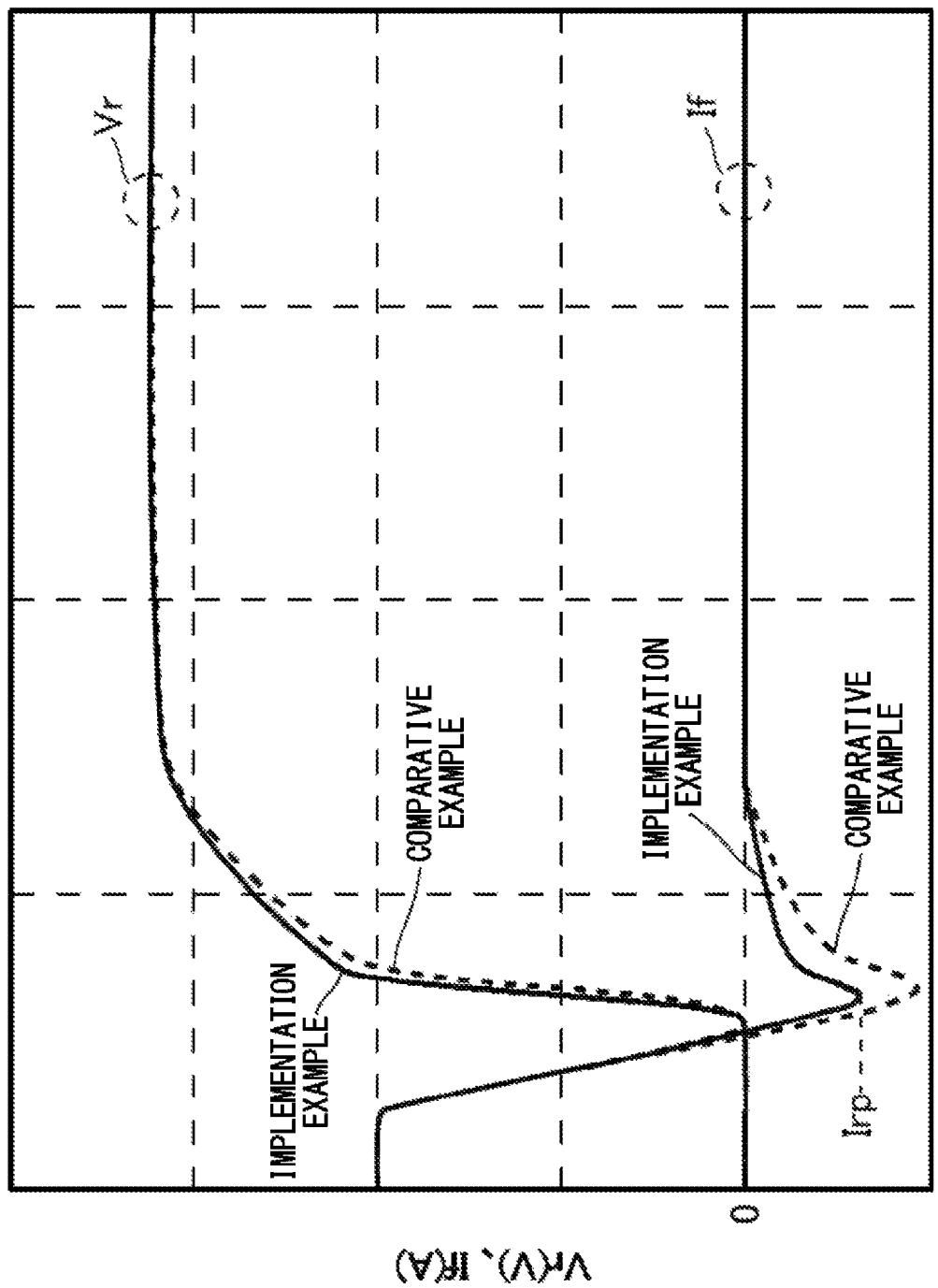
FIG. 12 illustrates a figure comparing characteristics of the semiconductor device 100 according to an implementation example and a semiconductor device according to a comparative example.

FIG. 12 illustrates a figure comparing characteristics of the semiconductor device 100 according to an implementation example and a semiconductor device according to a comparative example. In FIG. 12, the waveforms of the forward current If in the diode portion 80 when the transistor portion 70 is turned off and the anode-cathode voltage Vr of the diode portion 80 are shown. The structure of the semiconductor device of the comparative example are the same as the semiconductor device 100, excepting for the point of being without the trench contact 54.

As shown in FIG. 12, the peak current Irp during reverse recovery of the semiconductor device 100 according to the implementation example becomes smaller than the peak current in the comparative example when compared with the comparative example. Therefore, the semiconductor device 100 can have the reverse recovery loss reduced. This is considered to be due to the injection of carriers from the contact regions 15 being suppressed by providing the trench contact 54.

Figure 13:
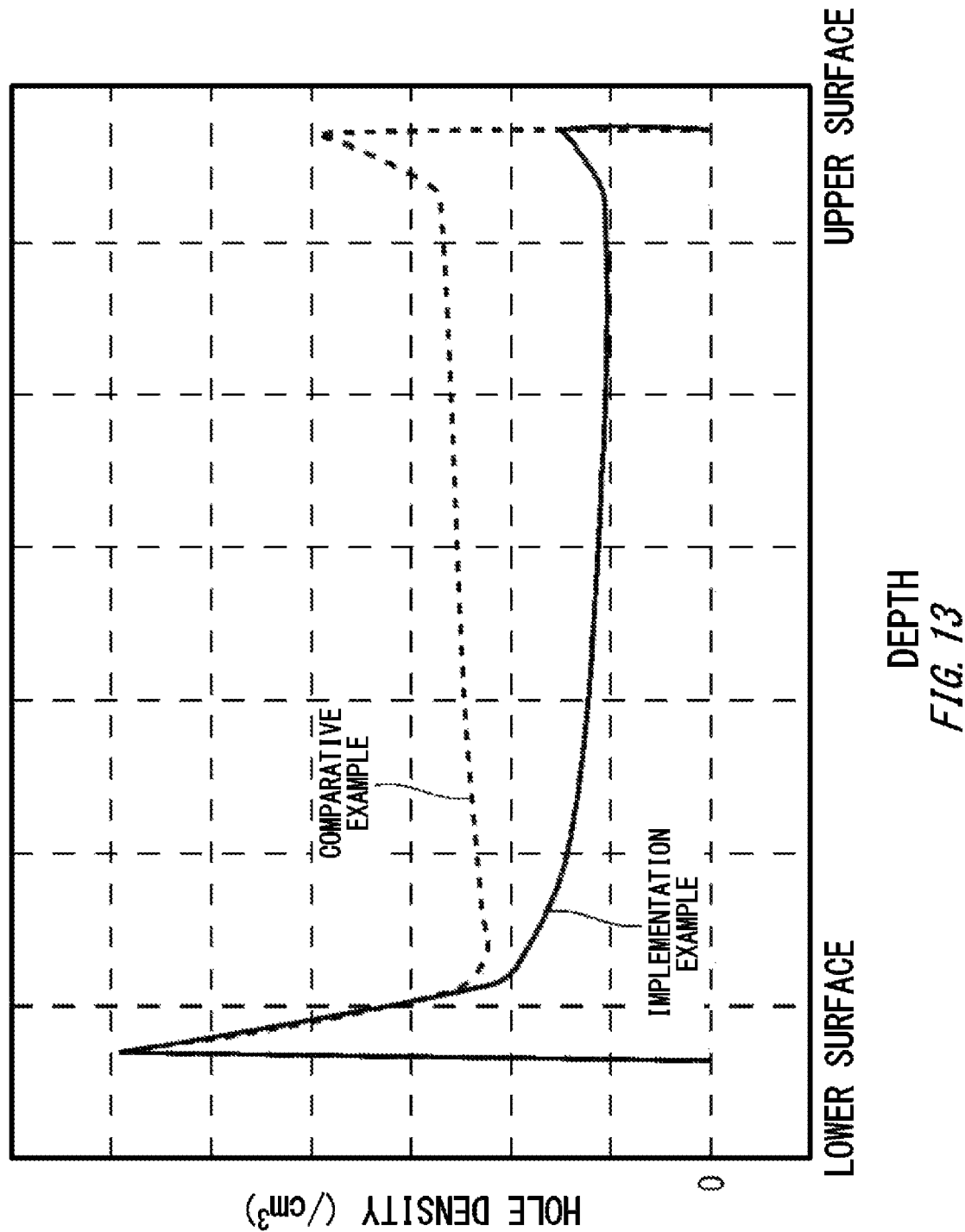
FIG. 13 illustrates hole density distribution examples in a depth direction in diode portions 80 of the implementation example and the comparative example.

FIG. 13 illustrates the hole density distribution examples in a depth direction in the diode portions 80 of the implementation example and the comparative example. In FIG. 13, of the diode portion 80, the hole density of the region adjacent to the transistor portion 70 is shown. As shown in FIG. 13, it can be seen that, by providing the trench contact 54, the hole density of the implementation example particularly on the upper surface (anode) side is decreased.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 11: well region; 12: emitter region; 14: base region; 15: contact region; 16: accumulation region; 18: drift region; 20: buffer region; 21: upper surface; 22: collector region; 23: lower surface; 24: collector electrode; 29: linear portion; 30: dummy trench portion; 31: edge portion; 32: dummy insulating film; 34: dummy conductive portion; 38: interlayer dielectric film; 39: linear portion; 40: gate trench portion; 41: edge portion; 42: gate insulating film; 44: gate conductive portion; 52: emitter electrode; 54: trench contact; 55: high-concentration plug region; 56: contact hole; 57: contact trench; 58: boundary portion; 60, 61, 62: mesa portion; 70: transistor portion; 72: boundary portion; 78: end region; 80: diode portion; 81: extension region; 82: cathode region; 90: edge termination structure portion; 100: semiconductor device; 102: end side; 112: gate pad; 120: active portion; 130: outer circumferential gate runner; 131: active side gate runner; 202: mask pattern; 204: conductive material

What is claimed is:

1. A semiconductor device, comprising:
a semiconductor substrate; and
a first electrode provided above an upper surface of the semiconductor substrate,
wherein the semiconductor substrate has a first conductive type drift region,
wherein the semiconductor substrate has a second conductive type base region provided between the drift region and the upper surface of the semiconductor substrate,
wherein the semiconductor substrate has a second conductive type contact region with a higher impurity concentration than the base region, which is provided between the base region and the upper surface of the semiconductor substrate,
wherein the semiconductor substrate has a trench contact that has a conductive material in an interior of a groove portion penetrating the contact region, the conductive material being in contact with at least a part of the semiconductor substrate, and connected to the first electrode,
wherein the semiconductor substrate has a second conductive type first high-concentration region with a higher impurity concentration than the base region, which is provided under a bottom surface of the groove portion, and
wherein an upper surface of the first high-concentration region is provided in a position deeper than the contact region in an interior of the semiconductor substrate.

2. The semiconductor device according to claim 1, wherein:
in a depth direction of the semiconductor substrate, a thickness of the first high-concentration region is less than a thickness of the contact region.

3. The semiconductor device according to claim 2, wherein:
a lower end of the first high-concentration region is arranged above a lower end of the base region.

4. The semiconductor device according to claim 1, wherein:
the semiconductor substrate further has a first conductive type second high-concentration region with a higher impurity concentration than the drift region, which is provided between the base region and the upper surface of the semiconductor substrate; and
the conductive material is in contact with the second high-concentration region.

5. The semiconductor device according to claim 4, wherein:
the contact region is provided in a position deeper than the second high-concentration region.

6. The semiconductor device according to claim 1, wherein:
the conductive material is in contact with the contact region.

7. The semiconductor device according to claim 1, wherein:
the conductive material is in contact with the first high-concentration region.

8. The semiconductor device according to claim 1, wherein:
the semiconductor substrate is a silicon substrate or a compound semiconductor substrate.

9. The semiconductor device according to claim 1, wherein:
the conductive material is formed of the same material as the first electrode and is provided continuously with the first electrode.

10. The semiconductor device according to claim 1, wherein the semiconductor substrate has a plurality of trench portions provided from the upper surface of the semiconductor substrate to the drift region;

wherein the semiconductor substrate has a mesa portion sandwiched between two trench portions of the plurality of trench portions;

wherein the plurality of trench portions have a conductive portion; and wherein an interlayer dielectric film is provided between the conductive portion and the first electrode.

11. The semiconductor device according to claim 10, wherein:

the plurality of trench portions are arranged along a first direction in a top view, and a width of the groove portion in the first direction is once or more of a distance in the first direction between the groove portion and the trench portion.

12. The semiconductor device according to claim 10, wherein:

the plurality of trench portions are arranged along a first direction in a top view; and a width of the first high-concentration region in the first direction is larger than a width of the bottom surface of the groove portion in the first direction.

13. The semiconductor device according to claim 10, wherein:

the plurality of trench portions include a gate trench portion and a dummy trench portion.

14. The semiconductor device according to claim 10, wherein:

the plurality of trench portions are arranged along a first direction in a top view; and at an end region that is an end of active portion in the first direction, the trench contact is provided.

15. The semiconductor device according to claim 14, wherein:

the semiconductor substrate has a second conductive type well region that has a bottom surface in a position deeper than the base region, and covers the active portion; and the end region is located between the well region and the trench portion in an outermost in a first direction.

16. The semiconductor device according to claim 10, comprising:

an interlayer dielectric film provided between the semiconductor substrate and the first electrode, wherein the semiconductor substrate has a floating mesa portion that is provided between two of the plurality of trench portions, and is electrically insulated from the first electrode by the interlayer dielectric film.

17. The semiconductor device according to claim 16, wherein:

at least a part of the interlayer dielectric film is embedded in the trench portion.

18. The semiconductor device according to claim 1, wherein:

the first high-concentration region covers the bottom surface of the groove portion.

19. A production method of a semiconductor device including a semiconductor substrate having a first conductive type drift region, a second conductive type base region provided between the drift region and an upper surface of the semiconductor substrate, and a second conductive type contact region with a higher impurity concentration than the base region, which is provided between the base region and the upper surface of the semiconductor substrate, comprising:

forming a groove portion penetrating the contact region by etching the upper surface of the semiconductor substrate;

forming a second conductive type first high-concentration region with a higher doping concentration than the base region, under a bottom surface of the groove portion;

forming a trench contact, by providing a conductive material being in contact with at least a part of the semiconductor substrate, in an interior of the groove portion; and forming a first electrode above the upper surface of the semiconductor substrate, wherein an upper surface of the first high-concentration region is provided in a position deeper than the contact region in an interior of the semiconductor substrate.

20. The production method according to claim 19, further comprising:

forming an interlayer dielectric film in an interior of the groove portion and on the upper surface of the semiconductor substrate and etching back the interlayer dielectric film on the upper surface of the semiconductor substrate.

* * * * *